(12) United States Patent
Kumar et al.

(10) Patent No.: US 7,309,843 B2
(45) Date of Patent: Dec. 18, 2007

(54) PLASMA-ASSISTED JOINING

(75) Inventors: Devendra Kumar, Rochester Hills, MI (US); Satyendra Kumar, Troy, MI (US)

(73) Assignee: BTU International, Inc., N. Billerica, MA (US)

( * ) Notice: Subject to any disclaimer, the term of this patent is extended or adjusted under 35 U.S.C. 154(b) by 533 days.

(21) Appl. No.: 10/971,180

(22) Filed: Oct. 21, 2004

(65) Prior Publication Data

US 2005/0061446 A1 Mar. 24, 2005

Related U.S. Application Data

(63) Continuation of application No. 10/430,414, filed on May 7, 2003, now Pat. No. 6,870,124.

(60) Provisional application No. 60/378,693, filed on May 8, 2002, provisional application No. 60/435,278, filed on Dec. 23, 2002, provisional application No. 60/430,677, filed on Dec. 4, 2002.

(51) Int. Cl.
*B23K 9/02* (2006.01)

(52) U.S. Cl. .......................... 219/121.59; 219/121.46; 219/121.36

(58) Field of Classification Search ........... 219/121.59, 219/121.46, 121.11, 121.36, 121.45, 693, 219/695, 738, 745, 746, 750; 419/9, 11, 419/12, 13, 14
See application file for complete search history.

(56) References Cited

U.S. PATENT DOCUMENTS

| | | | |
|---|---|---|---|
| 3,432,296 A | 3/1969 | McKinnon et al. | |
| 3,612,686 A | 10/1971 | Braman et al. | |
| 3,731,047 A | 5/1973 | Mullen et al. | |
| 4,004,934 A | 1/1977 | Prochazka | |
| 4,025,818 A | 5/1977 | Giguere et al. | |
| 4,090,055 A | 5/1978 | King | |
| 4,147,911 A | 4/1979 | Nishitani | |
| 4,151,034 A | 4/1979 | Yamamoto et al. | |

(Continued)

FOREIGN PATENT DOCUMENTS

DE 222 348 A1 5/1985

(Continued)

OTHER PUBLICATIONS

Willert-Porada, M., "Alternative Sintering Methods" 1 page Abstract dated Nov. 8, 2001, http://www.itap.physik.uni-stuttgart.de/~gklg/neu/english/welcome.php?/~gkig/neu/abstracts/abstract_willert-porada.html.

(Continued)

*Primary Examiner*—Quang Van
(74) *Attorney, Agent, or Firm*—Weingarten, Schurgin, Gagnebin & Lebovici LLP

(57) ABSTRACT

Methods and apparatus for plasma-assisted joining of one or more parts together are provided. The joining process may include, for example, placing at least first and second joining areas in proximity to one another in a cavity, forming a plasma in the cavity by subjecting a gas to electromagnetic radiation in the presence of a plasma catalyst, and sustaining the plasma at least until the first and second joining areas are joined. Plasma catalysts, and methods and apparatus for igniting, modulating, and sustaining a joining plasma, are provided. Additional cavity shapes, and methods and apparatus for selective plasma-joining, are also provided.

11 Claims, 8 Drawing Sheets

U.S. PATENT DOCUMENTS

| | | |
|---|---|---|
| 4,213,818 A | 7/1980 | Lemons et al. |
| 4,230,448 A | 10/1980 | Ward et al. |
| 4,265,730 A | 5/1981 | Hirose et al. |
| 4,307,277 A | 12/1981 | Maeda et al. |
| 4,339,326 A | 7/1982 | Hirose et al. |
| 4,404,456 A | 9/1983 | Cann |
| 4,473,736 A | 9/1984 | Bloyet et al. |
| 4,479,075 A | 10/1984 | Elliott |
| 4,500,564 A | 2/1985 | Enomoto |
| 4,504,007 A | 3/1985 | Anderson, Jr. et al. |
| 4,609,808 A | 9/1986 | Bloyet et al. |
| 4,611,108 A | 9/1986 | Leprince et al. |
| 4,624,738 A | 11/1986 | Westfall et al. |
| 4,666,775 A | 5/1987 | Kim et al. |
| 4,687,560 A | 8/1987 | Tracy |
| 4,698,234 A | 10/1987 | Ovshinsky |
| 4,760,230 A | 7/1988 | Hassler |
| 4,767,902 A | 8/1988 | Palaith et al. |
| 4,772,770 A | 9/1988 | Matsui et al. |
| 4,792,348 A | 12/1988 | Pekarsky |
| 4,840,139 A | 6/1989 | Takei |
| 4,871,581 A | 10/1989 | Yamazaki |
| 4,877,589 A | 10/1989 | O'Hare |
| 4,877,938 A | 10/1989 | Rau et al. |
| 4,883,570 A | 11/1989 | Efthimion et al. |
| 4,888,088 A | 12/1989 | Slomowitz |
| 4,891,488 A | 1/1990 | Davis |
| 4,908,492 A | 3/1990 | Okamoto et al. |
| 4,919,077 A | 4/1990 | Oda et al. |
| 4,924,061 A | 5/1990 | Labat et al. |
| 4,946,547 A | 8/1990 | Palmour et al. |
| 4,956,590 A | 9/1990 | Phillips |
| 4,963,709 A | 10/1990 | Kimrey, Jr. |
| 4,972,799 A | 11/1990 | Misumi et al. |
| 5,003,152 A | 3/1991 | Matsuo |
| 5,010,220 A | 4/1991 | Apte et al. |
| 5,017,404 A | 5/1991 | Paquet et al. |
| 5,023,056 A | 6/1991 | Aklufi et al. |
| 5,058,527 A | 10/1991 | Ohta et al. |
| 5,072,650 A | 12/1991 | Phillips |
| 5,074,112 A | 12/1991 | Walton et al. |
| 5,085,885 A | 2/1992 | Foley et al. |
| 5,087,272 A | 2/1992 | Nixdorf |
| 5,103,715 A | 4/1992 | Phillips |
| 5,120,567 A | 6/1992 | Frind et al. |
| 5,122,633 A | 6/1992 | Moshammer et al. |
| 5,131,993 A | 7/1992 | Suib et al. |
| 5,164,130 A | 11/1992 | Holcombe et al. |
| 5,202,541 A | 4/1993 | Patterson et al. |
| 5,222,448 A | 6/1993 | Morgenthaler et al. |
| 5,223,308 A | 6/1993 | Doehler |
| 5,224,117 A | 6/1993 | Kruger et al. |
| 5,227,695 A | 7/1993 | Pelletier et al. |
| 5,271,963 A | 12/1993 | Eichman et al. |
| 5,276,297 A | 1/1994 | Nara |
| 5,276,386 A | 1/1994 | Watanabe et al. |
| 5,277,773 A | 1/1994 | Murphy |
| 5,284,544 A | 2/1994 | Mizutani et al. |
| 5,304,766 A | 4/1994 | Baudet et al. |
| 5,307,892 A | 5/1994 | Phillips |
| 5,310,426 A | 5/1994 | Mori |
| 5,311,906 A | 5/1994 | Phillips |
| 5,316,043 A | 5/1994 | Phillips |
| 5,321,223 A | 6/1994 | Kimrey, Jr. et al. |
| 5,349,154 A | 9/1994 | Harker et al. |
| 5,366,764 A | 11/1994 | Sunthankar |
| 5,370,525 A | 12/1994 | Gordon |
| 5,423,180 A | 6/1995 | Nobue et al. |
| 5,435,698 A | 7/1995 | Phillips |
| 5,449,887 A | 9/1995 | Holcombe et al. |
| 5,505,275 A | 4/1996 | Phillips |
| 5,514,217 A | 5/1996 | Niino et al. |
| 5,520,740 A | 5/1996 | Kanai et al. |
| 5,521,360 A | 5/1996 | Johnson et al. |
| 5,523,126 A | 6/1996 | Sano et al. |
| 5,527,391 A | 6/1996 | Echizen et al. |
| 5,536,477 A | 7/1996 | Cha et al. |
| 5,597,456 A | 1/1997 | Maruyama et al. |
| 5,607,509 A | 3/1997 | Schumacher et al. |
| 5,616,373 A | 4/1997 | Karner et al. |
| 5,645,897 A | 7/1997 | Andra |
| 5,651,825 A | 7/1997 | Nakahigashi et al. |
| 5,662,965 A | 9/1997 | Deguchi et al. |
| 5,670,065 A | 9/1997 | Bickmann et al. |
| 5,671,045 A | 9/1997 | Woskov |
| 5,682,745 A | 11/1997 | Phillips |
| 5,689,949 A | 11/1997 | DeFreitas et al. |
| 5,712,000 A | 1/1998 | Wei et al. |
| 5,714,010 A | 2/1998 | Matsuyama et al. |
| 5,715,677 A | 2/1998 | Wallman et al. |
| 5,734,501 A | 3/1998 | Smith |
| 5,735,451 A | 4/1998 | Mori et al. |
| 5,741,364 A | 4/1998 | Kodama et al. |
| 5,755,097 A | 5/1998 | Phillips |
| 5,794,113 A | 8/1998 | Munir et al. |
| 5,796,080 A | 8/1998 | Jennings et al. |
| 5,808,282 A | 9/1998 | Apte et al. |
| 5,828,338 A | 10/1998 | Gerstenberg |
| 5,841,237 A | 11/1998 | Alton |
| 5,847,355 A | 12/1998 | Barmatz et al. |
| 5,848,348 A | 12/1998 | Dennis |
| 5,859,404 A | 1/1999 | Wei et al. |
| 5,868,871 A | 2/1999 | Yokose et al. |
| 5,874,705 A | 2/1999 | Duan |
| 5,904,993 A | 5/1999 | Takeuchi et al. |
| 5,939,026 A | 8/1999 | Seki et al. |
| 5,945,351 A | 8/1999 | Mathuni |
| 5,961,773 A | 10/1999 | Ichimura et al. |
| 5,961,871 A | 10/1999 | Bible et al. |
| 5,973,289 A | 10/1999 | Read et al. |
| 5,976,429 A | 11/1999 | Chen et al. |
| 5,980,843 A | 11/1999 | Silversand |
| 5,980,999 A | 11/1999 | Goto et al. |
| 5,989,477 A | 11/1999 | Berger |
| 5,993,612 A | 11/1999 | Rostaing et al. |
| 5,998,774 A | 12/1999 | Joines et al. |
| 6,011,248 A | 1/2000 | Dennis |
| 6,028,393 A | 2/2000 | Izu et al. |
| 6,038,854 A | 3/2000 | Penetrante et al. |
| 6,054,693 A | 4/2000 | Barmatz et al. |
| 6,054,700 A | 4/2000 | Rokhvarger et al. |
| 6,096,389 A | 8/2000 | Kanai |
| 6,101,969 A | 8/2000 | Niori et al. |
| 6,103,068 A | 8/2000 | Merten et al. |
| 6,122,912 A | 9/2000 | Phillips |
| 6,131,386 A | 10/2000 | Trumble |
| 6,132,550 A | 10/2000 | Shiomi |
| 6,149,985 A | 11/2000 | Grace et al. |
| 6,152,254 A | 11/2000 | Phillips |
| 6,153,868 A | 11/2000 | Marzat |
| 6,183,689 B1 | 2/2001 | Roy et al. |
| 6,186,090 B1 | 2/2001 | Dotter, II et al. |
| 6,189,482 B1 | 2/2001 | Zhao et al. |
| 6,204,606 B1 | 3/2001 | Spence et al. |
| 6,224,836 B1 | 5/2001 | Moisan et al. |
| 6,228,773 B1 | 5/2001 | Cox |
| 6,238,629 B1 | 5/2001 | Barankova et al. |
| 6,248,206 B1 | 6/2001 | Herchen et al. |
| 6,264,812 B1 | 7/2001 | Raaijmakers et al. |
| 6,284,202 B1 | 9/2001 | Cha et al. |
| 6,287,980 B1 | 9/2001 | Hanazaki et al. |
| 6,287,988 B1 | 9/2001 | Nagamine et al. |
| 6,297,172 B1 | 10/2001 | Kashiwagi |
| 6,297,595 B1 | 10/2001 | Stimson et al. |

| | | | | | | |
|---|---|---|---|---|---|---|
| 6,329,628 B1 | 12/2001 | Kuo et al. | | JP | 09-027482 A | 1/1997 |
| 6,342,195 B1 | 1/2002 | Roy et al. | | JP | 09-078240 A | 3/1997 |
| 6,345,497 B1 | 2/2002 | Penetrante | | JP | 09-102400 A | 4/1997 |
| 6,348,158 B1 | 2/2002 | Samukawa | | JP | 09-102488 A | 4/1997 |
| 6,358,361 B1 | 3/2002 | Matsumoto | | JP | 09-111461 A | 4/1997 |
| 6,362,449 B1 | 3/2002 | Hadidi et al. | | JP | 09-137274 A | 5/1997 |
| 6,365,885 B1 * | 4/2002 | Roy et al. ............... 219/750 | | JP | 09-157048 A | 6/1997 |
| 6,367,412 B1 | 4/2002 | Ramaswamy et al. | | JP | 09-223596 A | 8/1997 |
| 6,370,459 B1 | 4/2002 | Phillips | | JP | 09-235686 A | 9/1997 |
| 6,372,304 B1 | 4/2002 | Sano et al. | | JP | 09-251971 A | 9/1997 |
| 6,376,027 B1 | 4/2002 | Lee et al. | | JP | 09-295900 A | 11/1997 |
| 6,383,333 B1 | 5/2002 | Haino et al. | | JP | 10-066948 A | 3/1998 |
| 6,383,576 B1 | 5/2002 | Matsuyama | | JP | 10-081588 A | 3/1998 |
| 6,388,225 B1 | 5/2002 | Blum et al. | | JP | 10-081970 A | 3/1998 |
| 6,392,350 B1 | 5/2002 | Amano | | JP | 10-087310 A | 4/1998 |
| 6,407,359 B1 | 6/2002 | Lagarde et al. | | JP | 10-204641 A | 8/1998 |
| 6,488,112 B1 | 12/2002 | Kleist | | JP | 10-259420 A | 9/1998 |
| 6,512,216 B2 | 1/2003 | Gedevanishvili et al. | | JP | 10-294306 A | 11/1998 |
| 6,522,055 B2 | 2/2003 | Uemura et al. | | JP | 11-031599 A | 2/1999 |
| 6,575,264 B2 | 6/2003 | Spadafora | | JP | 11-106947 A | 4/1999 |
| 6,592,664 B1 | 7/2003 | Frey et al. | | JP | 11-145116 A | 5/1999 |
| 6,610,611 B2 | 8/2003 | Liu et al. | | JP | 11-186222 A | 7/1999 |
| 6,712,298 B2 | 3/2004 | Kohlberg et al. | | JP | 11-228290 A | 8/1999 |
| 6,717,368 B1 | 4/2004 | Sakamoto et al. | | JP | 11-265885 A | 9/1999 |
| 6,870,124 B2 | 3/2005 | Kumar et al. | | JP | 11-273895 A | 10/1999 |
| 7,132,621 B2 * | 11/2006 | Kumar et al. ......... 219/121.59 | | JP | 11-297266 A | 10/1999 |
| 2001/0027023 A1 | 10/2001 | Ishihara et al. | | JP | 2000-012526 A | 1/2000 |
| 2001/0028919 A1 | 10/2001 | Liu et al. | | JP | 2000-173989 A | 6/2000 |
| 2002/0034461 A1 | 3/2002 | Segal | | JP | 2000-203990 A | 7/2000 |
| 2002/0036187 A1 | 3/2002 | Ishll et al. | | JP | 2000-269182 A | 9/2000 |
| 2002/0124867 A1 | 9/2002 | Kim et al. | | JP | 2000-288382 A | 10/2000 |
| 2002/0135308 A1 | 9/2002 | Janos et al. | | JP | 2000-306901 A | 11/2000 |
| 2002/0140381 A1 | 10/2002 | Golkowski et al. | | JP | 2000-310874 A | 11/2000 |
| 2002/0190061 A1 | 12/2002 | Gerdes et al. | | JP | 2000-310876 A | 11/2000 |
| 2002/0197882 A1 | 12/2002 | Niimi et al. | | JP | 2000-317303 A | 11/2000 |
| 2003/0071037 A1 | 4/2003 | Sato et al. | | JP | 2000-323463 A | 11/2000 |
| 2003/0111334 A1 | 6/2003 | Dodelet et al. | | JP | 2000-348897 A | 12/2000 |
| 2003/0111462 A1 | 6/2003 | Sato et al. | | JP | 2001-013719 A | 1/2001 |
| 2004/0001295 A1 | 1/2004 | Kumar et al. | | JP | 2001-053069 A | 2/2001 |
| 2004/0004062 A1 | 1/2004 | Kumar et al. | | JP | 2001-058127 A | 3/2001 |
| 2004/0070347 A1 | 4/2004 | Nishida et al. | | JP | 2001-093871 A | 4/2001 |
| 2004/0089631 A1 | 5/2004 | Blalock et al. | | JP | 2001-149754 A | 6/2001 |
| 2004/0107796 A1 | 6/2004 | Kumar et al. | | JP | 2001-149918 A | 6/2001 |
| 2004/0107896 A1 | 6/2004 | Kumar et al. | | JP | 2001-196420 A | 7/2001 |
| 2004/0118816 A1 | 6/2004 | Kumar et al. | | JP | 2001-303252 A | 10/2001 |
| | | | | JP | 2001-332532 A | 11/2001 |
| FOREIGN PATENT DOCUMENTS | | | | JP | 2001-351915 A | 12/2001 |
| DE | 195 42 352 A1 | 5/1997 | | JP | 2002-022135 A | 1/2002 |
| DE | 100 05 146 A1 | 8/2001 | | JP | 2002-028487 A | 1/2002 |
| EP | 0 335 675 A2 | 10/1989 | | JP | 2002-069643 A | 3/2002 |
| EP | 0 228 864 B1 | 3/1991 | | JP | 2002-075960 A | 3/2002 |
| EP | 0 420 101 A2 | 4/1991 | | JP | 2002-126502 A | 5/2002 |
| EP | 0 435 591 A2 | 7/1991 | | JP | 2002-273161 A | 9/2002 |
| EP | 0 436 361 A1 | 7/1991 | | JP | 2002-273168 A | 9/2002 |
| EP | 0 520 719 B1 | 5/1996 | | JP | 2003-075070 A | 3/2003 |
| EP | 0 670 666 B1 | 6/1998 | | JP | 2003-264057 A | 9/2003 |
| EP | 0 724 720 B1 | 5/2000 | | WO | WO 95-11442 A1 | 4/1995 |
| EP | 1 093 846 A1 | 4/2001 | | WO | WO 96/06700 A1 | 3/1996 |
| EP | 1 427 265 A2 | 6/2004 | | WO | WO 96/38311 A1 | 12/1996 |
| JP | 56-140021 A2 | 11/1981 | | WO | WO 97-13141 A1 | 4/1997 |
| JP | 57-119164 A2 | 7/1982 | | WO | WO 01-55487 A2 | 8/2001 |
| JP | 58-025073 A | 2/1983 | | WO | WO 01-58223 A1 | 8/2001 |
| JP | 59-169053 A | 9/1984 | | WO | WO 01-82332 A1 | 11/2001 |
| JP | 62-000535 A | 1/1987 | | WO | WO 02-26005 A1 | 3/2002 |
| JP | 04-74858 A | 3/1992 | | WO | WO 02-061165 A1 | 8/2002 |
| JP | 06-345541 A | 12/1994 | | WO | WO 02-061171 A1 | 8/2002 |
| JP | 07-153405 A | 6/1995 | | WO | WO 02-062114 A1 | 8/2002 |
| JP | 08-217558 A | 8/1996 | | WO | WO 02-062115 A1 | 8/2002 |
| JP | 08-281423 A | 10/1996 | | WO | WO 02-067285 A2 | 8/2002 |
| JP | 09-017597 A | 1/1997 | | WO | WO 02-067285 A3 | 8/2002 |
| JP | 09-023458 A | 1/1997 | | WO | WO 03-018862 A2 | 3/2003 |
| JP | 09-027459 A | 1/1997 | | WO | WO 03-018862 A3 | 3/2003 |
| | | | | WO | WO 03-028081 A2 | 4/2003 |

| | | |
|---|---|---|
| WO | WO 03-095058 A2 | 11/2003 |
| WO | WO 03-095089 A1 | 11/2003 |
| WO | WO 03-095090 A1 | 11/2003 |
| WO | WO 03-095130 A1 | 11/2003 |
| WO | WO 03-095591 A1 | 11/2003 |
| WO | WO 03-095699 A1 | 11/2003 |
| WO | WO 03-095807 A1 | 11/2003 |
| WO | WO 03-096369 A1 | 11/2003 |
| WO | WO 03-096370 A1 | 11/2003 |
| WO | WO 03-096380 A2 | 11/2003 |
| WO | WO 03-096381 A2 | 11/2003 |
| WO | WO 03-096382 A2 | 11/2003 |
| WO | WO 03-096383 A2 | 11/2003 |
| WO | WO 03-096747 A2 | 11/2003 |
| WO | WO 03-096749 A1 | 11/2003 |
| WO | WO 03-096766 A1 | 11/2003 |
| WO | WO 03-096768 A1 | 11/2003 |
| WO | WO 03-096770 A1 | 11/2003 |
| WO | WO 03-096771 A1 | 11/2003 |
| WO | WO 03-096772 A1 | 11/2003 |
| WO | WO 03-096773 A1 | 11/2003 |
| WO | WO 03-096774 A1 | 11/2003 |
| WO | WO 2004-050939 A2 | 6/2004 |

OTHER PUBLICATIONS

"Carbonitriding," Treat All Metals, Inc., 2 pages—http://www.treatallmetals.com/carbon.htm.

"Carburizing," Treat All Metals, Inc.—http://www.treatallmetals.com/gas.htm, 2 pages.

"Classical Plasma Applications," 2 pages (2002)—http://www.plasma.iinpe.br/English/Classical_Applications.htm.

"Classification of Cast Iron"—Key to Steel—Article—http://www.key-to-steel.com/Articles/Art63.htm, 3 pages (1999).

"Controlled Atmospheres Sinter-Hardening,," Sarnes Ingenieure, 2 pages, http://www.space-ctrl.de/de/2002/06/399.php (2002).

"Heat Treatment of Steels—The Processes," AZoM.com, 9 pages, (2002)—www.azom.com.

"How A Blast Furnace Works—The Blast Furnace Plant," AISI Learning Center, 7 pages, http://www.steel.org/learning/howmade/blast_furnace.htm, undated.

"How Is Steel Made," Answer Discussion, 6 pages—http://ourworld.compuserve.com/homepages/Dyaros/stlmanuf.htm, undated.

"IRC in Materials Processing: Advanced Melting, Atomisation, Powder and Spray Forming, Plasma Melting—Operation of a Plasma Furnace," University of Birmingham website, 3 pages—http://www.irc.bham.ac.uk/theme1/plasma/furnace.htm, undated.

"Micro-fabricated Palladium-Silver Membrane for Hydrogen Separation and Hydro/Dehydrogenation Reactions," Research Education Group webpage, 5 pages—http://utep.el.utwente.nl/tt/projects/sepmem/—undated.

"Microwave Welding of Plastics," TWI World Centre for Materials Joining Technology, 2 pages (Aug. 2002)—http://www.twi.co.uk/j32k/protected/band_3/ksab001.htm.

"Microwave Welding," EWI WeldNet, 1 page—(2003) http://www.ferris.edu/cot/accounts/plastics/htdocs/Prey/Microwave%20Homepage.htm.

"Microwave Welding," Welding and Joining Information Network, 3 pages (Nov. 2002)—http://www.ewi.org/technologies/plastics/microwave.asp.

"Nitriding," Treat All Metals, Inc., 2 pages—Undated—http://www.treatallmetals.com/nitrid.htm.

"Novel Plasma Catalysts Significantly Reduce NOx from Diesel Engines," US Department of Energy research summary, 2 pages (Apr. 2001)—http://www.ott.doe.gov/success.html.

"Optoelectronic Packaging Applications," March Plasma Systems, Product Description, 2 pages (2002)—http://www.marchplasma.com/opto_app.htm.

"Plasma Applications," Coalition for Plasma Science, 2 pages (1999, 2000)—http://www.plasmacoalition.org/applications.htm.

"Plasma Carburizing," 1 page—Undated, http://www.ndkinc.co.jp/ndke04.html.

"Plasma Direct Melting Furnace," Materials Magic, Hitachi Metals Ltd., 3 pages—Undated, http://www.hitachi-metals.co.jp/e/prod/prod07/p07_2_02.html.

"Plasma Nitride Process Description," Northeast Coating Technologies, 2 pages, Undated, www.northeastcoating.com.

"Powder Metallurgy—Overview of the Powder Metallurgy Process," AZoM.com, 3 pages (2002)—http://www.azom.com/details.asp?ArticleID=1414.

"Printed Circuit Board (PCB) Plasma Applications," March Plasma Systems product descriptions, 2 pages (2002)—http://www.marchplasma.com/pcb_app.01.htm.

"Surface Hardening" Services Description for AHS Corp., 5 pages, Undated—http://www.ahscorp.com/surfaceh.html.

"testMAS: Pressure Sintering," 11 pages, Undated—http://cybercut.berkley.edu/mas2/processes/sinter_pressure.

"Using Non-Thermal Plasma Reactor to Reduce NOx Emissions from CIDI Engines," Office of Energy Efficiency and Renewable Energy, Office of Transportation, 1 page (Apr. 1999).

"Welding Plastic Parts," Business New Publishing Company, 4 pages (Nov. 2000)—http://www.assemblymag.com/Common/print_article.asp?rID=E455512C17534C31B96D.

Accentus Corporate Overview, 3 pages—http://www.accentus.co.uk/ipco/html/techenv6_txt_fr.html (2003).

Agrawal et al., "Grain Growth Control in Microwave Sintering of Ultrafine WC-Co Composite Powder Compacts," Euro PM99 Conference, Sintering, Turino, Italy, 8 pages (1999).

Agrawal et al., "Microwave Sintering of Commercial WC/Co Based Hard Metal Tools," Euro PM99 Conference, Sintering, Turino, Italy, 8 pages (1999).

Agrawal, "Metal Parts from Microwaves," *Materials World* 7(11):672-673 (1999).

Agrawal, "Microwave Processing of Ceramics," *Current Opinion in Solid State and Materials Science* 3:480-485 (Oct. 1998).

Ahmed et al., "Microwave Joining of Alumina and Zirconia Ceramics," IRIS Research Topics 1998, 1 page (1998).

Air Liquide, "Heat Treatment—Gas Quenching," http://www.airliquide.com/en/business/industry/metals/applications/heat_treatment/quenching.asp, 1 page (2000).

Alexander et al., "Electrically Conductive Polymer Nanocomposite Materials," AFRL's Materials and Manufacturing Directorate, Non-metallic Materials Division, Polymer Branch, Wright-Patterson AFB OH—http://www.afrlhorizons.com/Briefs/Sept02/ML0206.html, 2 pages (Sep. 2002).

Al-Shamma'a et al., "Microwave Atmospheric Plasma for Cleaning Exhaust Gases and Particulates," Future Car Congress, Washington, Jun. 3-5, 2002 (1 page).

Alton et al., "A High-Density, RF Plasma-Sputter Negative Ion Source," The 8th Intl. Conf. on Heavy-Ion Accelerator Technology, Argonne Natl. Lab., Oct. 5-9, 1998, Poster Presentation (3 pages).

Anklekar et al., "Microwave Sintering and Mechanical Properties of PM Copper Steel," *Powder Metallurgy* 44(4):355-362 (2001).

Batanov et al., "Plasmachemical Deposition of Thin Films in a Localized Free-Space Microwave Discharge," *Technical Physics* 38(6):475-479 (Jun. 1993).

Cheng et al., "Microwave Processing of WC-Co Composites And Ferroic Titanates" *Mat. Res. Innovat.* 1(1):44-52 (Jun. 1997).

Cheng, J., "Fabricating Transparent Ceramics by Microwave Sintering," *Am. Ceramic Soc. Bull.* 79(9):71-74 (2000).

Circle Group Holdings, Inc., "StarTech Environmental Corp." http://www.crgq.com/cgiweb/HTML/eMentor_Companies/startech.html, 9 pages, undated.

Collin, in: *Foundations for Microwave Engineering*, 2nd Ed., IEEE Press, NY, pp. 180-192 (2001).

Egashira et al., "Decomposition of Trichloroethylene by Microwave-Induced Plasma Generated from SiC Whiskers," *J. Electrochem. Soc.* 145(1):229-235 (Jan. 1998).

Fincke, "Hydrogen Separation Membrane,—Advanced Gas Separation: H2 Separation," Summary of research proposal, 1 page (2003).

Ford 1.3L Catalytic Converter (1988-1989) product description—http://catalyticconverters.com/FO13L43778889.html, 1 page, undated.

Ford Contour Catalytic Converter (1995-1996) product description—http://www.all-catalytic-converters.com/ford-contour-converter.html, 2 pages, undated.

Fraunhofer Ilt, "Plasma-Reactors for Aftertreatment of Automobile Exhaust Gas," Fraunhofer-Gesellschaft—http://www.ilt.fhg.de/eng/jb01-s35.html, 1 page (2002).

French, "The Plasma Waste Converter—From Waste Disposal to Energy Creation," The International Chemical Weapons Demilitarization Conference, Gifu City, Japan (May 22-24, 2001)—http://www.arofe.army.mil/Conferences/CWC2001/French.htm, 1 page.

Gao et al., "Superfast Densification of Oxide/Oxide Ceramic Composites," *J. Am. Ceram. Soc.* 82(4)1061-1063 (1999).

Gedevanishvili et al., "Microwave Combustion Synthesis And Sintering of Intermetallics and Alloys," *J. Mat. Sci. Lett.* 18(9):665-668 (1999).

General Eastern, "Semiconductor Manufacturing—Using the HygroTwin 2850 to Reduce Costs, Improve Quality,", 3 pages, www.generaleastern.net (1997).

George, "The Catalytic Converter," 5 pages, (2002)—http://krioma.net/articles/Catalytic%20Converter/Catalytic%20Converter.htm.

GlassTesseract.Org website, "Tech Procedures and Tips: Exhaust Manifolds and Catalytic Converters Removal—and Installation," 4 pages (2003) http://glasstesseract.org/tech/catalytic.html.

*Hackh's Chemical Dictionary*, 3rd edition, J. Grant, Ed., McGraw Hill Book Co., NY, pp. 174-175 (1944).

Honda Automobile News Press Release, "Honda Introduces Its First Two Clean Air Vehicles, the Civic Ferio LEV and Partner 1.6 LEV," 3 pages (Feb. 1997)—http://world.honda.com/news/1997/4970217a.html.

Honda Civic CX Catalytic Converter, (1996-2000) 1 page—http://www.catalyticconverters.com/HOCIVICCX4349600.html, undated.

Hsu et al., "Palladium-Coated Kieselguhr for Simultaneous Separation and Storage of Hydrogen," Westinghouse Savannah River Company, U.S. Dept. of Commerce, National Technical Information Service, 14 pages (2001).

Japanese Advanced Environment Equipment, "Mitsubishi Graphite Electrode Type Plasma Furnace," 3 pages, undated—http://nett21.unep.or.jp/JSIM_DATA/WASTE/WASTE_3/html/Doc_467.html.

Johnson, Faculty Biography webpage, Dept. of Materials Science & Engineering, Northwestern University, 2 pages—http://www.matsci.northerwestern.edu/faculty/dlj.html, undated.

Kalyanaraman et al., "Synthesis and Consolidation of Iron Nanopowders," *NanoStructured Materials* 10(8):1379-1392 (1998).

Karger, Scientific Staff Research Areas for KTP Company, 2 pages (Nov. 2002)—http://wwwfb10.upb.de/KTP/KTP-ENG/Staff/Karger/body_karger.html.

Kong et al., "Nuclear-Energy-Assisted Plasma Technology for Producing Hydrogen," Nuclear Energy Research Initiative Research Proposal, 4 pages (2002).

Lewis, *Hawley's Condensed Chemical Dictionary*, 12th ed., pp. 230-232, Van Nostrand Reinhold, NY (1993).

Lucas, "Welding Breakthrough: Generating and Handling a Microwave Powered Plasma," Australian Industry News, Information & Suppliers, 7 pages (Sep. 2001)—http://www.industry/search.com.au/features/microwave.asp.

Lucas, "Welding Using Microwave Power Supplies," Faculty webpage, 1 page—http://www.liv.ac.uk/EEE/research/cer/project6.htm, undated.

Luggenholscher et al., "Investigations on Electric Field Distributions in a Microwave Discharge in Hydrogen," Institute fur Laser und Plasmaphysik, Univsitat Essen, Germany, 4 pages, undated.

March Plasma Systems, product descriptions, 2 pages (2002)—http://www.marchplasma.com/micro_app.htm.

Moss et al., "Experimental Investigation of Hydrogen Transport Through Metals," Experiment Description, Los Alamos National Library, 5 pages—Undated. http://www.education.lanl.gov/RESOURCES/h2/dye/education.html.

Paglieri et al., "Palladium Alloy Composite Membranes for Hydrogen Separation," 15th Annual Conf. Fossil Energy Matter, Knoxville, TN (2001), 5 pages.

Peelamedu et al., "Anisothermal Reaction Synthesis of Garnets, Ferrites, and Spinels In Microwave Field," *Materials Research Bulletin* 36:2723-2739 (Dec. 2001).

PerfectH2 PE8000 Series Product Description, Palladium Diffusion Hydrogen Purifier For High Flow Rate MOCVD Applications, Matheson Tri.Gas, 2 pages (2002).

Photonics Directory, Definition for Thyratron, (Laurin Publishing), 2 pages, undated http://www.photonics.com/dictionary/.

Pingel, "About What Every P/A Should Know About P/M," Powder Metallurgy Co., 9 pages, Undated—http://www.powdermetallurgyco.com/pm_about.htm.

Plasma Science and Technology, "Plasmas for Home, Business and Transportation," 4 pages, Undated—http://www.plasmas.org/rot-home.htm.

Roy et al., "Definitive Experimental Evidence for Microwave Effects: Radically New Effects of Separated E and H Fields, Such As Decrystallization of Oxides in Seconds," *Materials Research Innovations* 6(3):129-140 (2002).

Roy et al., "Full Sintering of Powdered-Metal Bodies In A Microwave Field," *Nature* 399:668-670 (Jun. 17, 1999).

Roy et al., "Major phase transformations and magnetic property changes caused by electromagnetic fields at microwave frequencies," *J. Mat. Res.* 17(12):3008-3011 (2002).

Roy et al., "Microwave Processing: Triumph of Applications-Driven Science in WC-Composites And Ferroic Titanates," *Ceramic Transactions* 80:3-26 (1997).

Rusanov, Introduction to the Hydrogen Energy & Plasma Technologies Institute: Russian Research Centre Kurchatov Institute, 13 pages, Undated—http://www.kiae.ru/eng/str/ihept/oiivept.htm.

Samant et al., "Glow Discharge Plasma Nitriding of AI 6063 Samples and Study of Their Surface Hardness," *Metallofiz. Noveishe Tekhnol.* 23(3):325-333 (2001).

Sato et al., "Surface Modification of Pure Iron by rf Plasma Nitriding with dc Bias Voltage Impression," *Hyomen Gijutsu* 48(3):317-323 (1997) (English Abstract).

Saveliev et al., "Effect of Cathode End Caps and a Cathode Emissive Surface on Relativistic Magnetron Operation," *IEEE Transactions on Plasma Science* 28:3.478-484 (Jun. 2000).

Saville, in: *Iron and Steel*, Chapter 6, pp. 16-22, Wayland Publ., England (1976).

SC/Tetra Engine Manifold Application, 2 pages (2001)—http://www.sctetra.com/applications/ 01_manifold.htm.

Shulman, "Microwaves In High-Temperature Processes," GrafTech Intl. Ltd., 8 pages (Mar. 2003) http://www.industrialheating.com/CDA/ArticleInformation/features/BNP_Features_Item/0,2832,94035,00.html.

Slone et al., "NOx Reduction For Lean Exhaust Using Plasma Assisted Catalysis," NOXTECH Inc., 5 pages (2000)—http://www.osti.gov/fcvt/deer2000/bhattpa.pdf.

Stockwell Rubber Company, Inc., "Conductive Silicone Rubber Compounds Product Selection Guide," Electrically Conductive Materials Chart, 3 pages, Undated—http://www.stockwell.com/electrically_conducive_produc.htm.

Sumitomo Heavy Industries, Ltd., "Spark Plasma Sintering," 3 pages (2001)—http://www.shi.co.jp/sps/eng/.

Takizawa et al., "Synthesis of inorganic materials by 28 GHz Microwave Irradiation," *Transactions of the Materials Research Society of Japan* 27(1):51-54 (2002).

Taube et al., "Advances in Design of Microwave Resonance Plasma Source," American Institute of Chemical Engineering, 2004 Annual Meeting, Presentation (Nov. 2004).

Thomas et al., "Non-Thermal Plasma Aftertreatment of Particulates—Theoretical Limits and Impact on Reactor Design," SAE Spring Fuels and Lubes Conference, Paris, France, 27 pages (Jun. 19-22, 2000) http://www.aeat.co.uk/electrocat/sae/saepaper.htm.

Toyota Motor Sales, "Emission Sub Systems—Catalytic Converter," 10 pages, undated.

Uchikawa et al., "New Technique of Activating Palladium Surface for Absorption of Hydrogen or Deuterium," *Japanese J. Appl. Phys.* 32:5095-5096, Part 1, No. 11A (Nov. 1993).

Wang et al., "Densification of $Al_2O_3$ Powder Using Spark Plasma Sintering," *J. Mater. Res.* 15(4):982-987 (Apr. 2000).

Way et al., "Palladium/Copper Alloy Composite Membranes for High Temperature Hydrogen Separation from Coal-Derived Gas Streams," Research Grant Report, Dept. of Chemical Engineering, Colorado School of Mines, 3 pages (1999).

Wolf et al., "The Amazing Metal Sponge: Simulations of Palladium-Hydride," 2 pages, Undated—http://www.psc.edu/science/Wolf/Wolf.html.

Xie et al., "Effect of Rare Earths in Steels on the Thermochemical Treatments and the Functional Mechanisms of the Rare Earths," *Rare Metals Materials and Engineering* 26(1):52-55 (Feb. 1997) English Abstract.

Yahoo Canada—Autos, "Catalytic Converter Answer2," 4 pages (2001)—http://ca.autos.yahoo.com/maintain/catalytic_converteranswer2.html.

International Search Report issued on Jun. 26, 2003, in PCT/US03/14037.

International Search Report issued on Jul. 8, 2003, in PCT/US03/14124.

International Search Report issued on Jun. 24, 2003, in PCT/US03/14132.

International Search Report issued on Jul. 29, 2003, in PCT/US03/14052.

International Search Report issued on Jul. 29, 2003, in PCT/US03/14054.

International Search Report issued on Apr. 27, 2004, in PCT/US03/14036.

International Search Report issued on Aug. 21, 2003, in PCT/US03/14053.

International Search Report issued on Feb. 8, 2004, in PCT/US03/14034.

International Search Report issued on Aug. 29, 2003, in PCT/US03/14039.

International Search Report issued on Aug. 21, 2003, in PCT/US03/14038.

International Search Report issued on Aug. 24, 2003, in PCT/US03/14133.

International Search Report issued on Jul. 28, 2003, in PCT/US03/14035.

International Search Report issued on Jun. 27, 2003, in PCT/US03/14040.

International Search Report issued on Jul. 17, 2003, in PCT/US03/14134.

International Search Report issued on Jun. 27, 2003, in PCT/US03/14122.

International Search Report issued on Jun. 24, 2003, in PCT/US03/14130.

International Search Report issued on Apr. 30, 2004, in PCT/US03/14055.

International Search Report issued on Apr. 30, 2004, in PCT/US03/140137.

International Search Report issued on Aug. 21, 2003, in PCT/US03/14123.

International Search Report issued on Jul. 29, 2003, in PCT/US03/14121.

International Search Report issued on Aug. 24, 2003, in PCT/US03/14136.

International Search Report issued on May 3, 2004, in PCT/US03/14135.

Written Opinion issued on Apr. 13, 2004, in PCT/US03/014037.

Examination Report issued on Feb. 24, 2004, in PCT/US03/14054.

Written Opinion issued on Dec. 22, 2003, in PCT/US03/14053.

Examination Report issued on Apr. 26, 2004, in PCT/US03/14053.

Written Opinion issued on Dec. 22, 2003, in PCT/US03/14123.

Examination Report issued on Apr. 26, 2004, in PCT/US03/14123.

Quayle Action issued on Apr. 19, 2005, in U.S. Appl. No. 10/449,600.

Office Action issued Jul. 27, 2005 in U.S. Appl. No. 10/449,600.

Quayle Action issued on Apr. 19, 2004, in U.S. Appl. No. 10/430,414.

Office Action issued on May 18, 2004, in U.S. Appl. No. 10/430,426.

Reply to Office Action filed on Nov. 18, 2004, in U.S. Appl. No. 10/430,426.

Office Action issued on Feb. 24, 2005, in U.S. Appl. No. 10/430,426.

"Carbonitriding," Treat All Metals, Inc., 2 pages—http://www.treatallmetals.com/carbon.htm, undated.

"Carburizing," Treat All Metals, Inc.—http://www.treatallmetals.com/gas.htm, 2 pages, undated.

* cited by examiner

PLASMA-ASSISTED JOINING

CROSS-REFERENCE OF RELATED APPLICATIONS

This is a continuation of application Ser. No. 10/430,414, filed May 7, 2003 now U.S. Pat. No. 6,870,124 which is incorporated herein by reference.

Priority is claimed to U.S. Provisional Patent Application No. 60/378,693, filed May 8, 2002, No. 60/430,677, filed Dec. 4, 2002, and No. 60/435,278, filed Dec. 23, 2002, all of which are fully incorporated herein by reference.

FIELD OF THE INVENTION

This invention relates to methods and apparatus for plasma-assisted joining two or more objects together and, particularly, to joining one or more portions of such objects in various types of cavities using a plasma catalyst.

BACKGROUND

It is known that a plasma can be ignited by subjecting a gas to a sufficient amount of electromagnetic radiation. It is also known that radiation-induced plasmas may be used to join parts. Igniting and sustaining plasmas, however, can be slow, expensive, and energy-consuming, especially when reduced pressures are needed to ignite the plasma. Therefore, use of conventional plasma-assisted joining can limit joining flexibility.

BRIEF SUMMARY OF A FEW ASPECTS OF THE INVENTION

Methods and apparatus for plasma assisted joining of one or more parts are provided. In one embodiment consistent with this invention, a method is provided for joining at least two parts using a plasma induced by electromagnetic radiation having a wavelength of $\lambda$. The method can include placing at least first and second joining areas in proximity to one another in a cavity, forming a plasma in the cavity by subjecting a gas to radiation in the presence of a plasma catalyst, and sustaining the plasma at least until the first and second joining areas are joined by directing the radiation into the cavity.

In another embodiment consistent with this invention, at least two parts to be joined (e.g., brazed) to each other may be placed in a cavity formed in a vessel. A plasma catalyst may be placed in or near the cavity. A brazing material (e.g., ring) may at least partially encircle one of the parts and abut the surface of the other part. In this embodiment, the brazing results from at least partial melting the brazing ring using a plasma induced by radiation.

A plasma catalyst for initiating, modulating, and sustaining a plasma consistent with this invention is also provided. The catalyst can be passive or active. A passive plasma catalyst can include any object capable of inducing a plasma by deforming a local electric field (including an electromagnetic field) consistent with this invention, without necessarily adding additional energy. An active plasma catalyst, on the other hand, is any particle or high-energy wave packet capable of transferring a sufficient amount of energy to a gaseous atom or molecule to remove at least one electron from the gaseous atom or molecule in the presence of electromagnetic radiation. In both cases, a plasma catalyst can improve, or relax, the environmental conditions required to ignite a plasma.

Additional plasma catalysts, and methods and apparatus for igniting, modulating, and sustaining a plasma consistent with this invention are provided. Additional cavity shapes, and methods and apparatus for selectively plasma-joining in general, are also provided.

BRIEF DESCRIPTION OF THE DRAWINGS

Further aspects of the invention will be apparent upon consideration of the following detailed description, taken in conjunction with the accompanying drawings, in which like reference characters refer to like parts throughout, and in which.

DETAILED DESCRIPTION OF THE EMBODIMENTS

This invention may relate to plasma-assisted joining of at least two parts for a variety of applications, including, for example, brazing, welding, bonding, soldering, etc. In particular, various cavity shapes, plasma catalysts, and methods for joining are provided;

The following connonly owned U.S. Patent Applications are hereby incorporated by reference in their entireties: U.S. patent application Ser. No. 10/513,221; U.S. patent application Ser. No. 10/513,393; PCT Application No. US03/14132, now expired; U.S. patent application Ser. No. 10/513,394; U.S. patent application Ser. No. 10/513,305; U.S. patent application Ser. No. 10/513,607; PCT Application No. US03/14034, now expired; U.S. patent application Ser. No. 10/430,416; U.S. patent application Ser. No. 10/430,415; PCT Application No. US03/14133, now expired; U.S. patent application Ser. No. 10/513,605; U.S. patent application Ser. No. 10/513,309; U.S. patent application Ser. No. 10/513,220; U.S. patent application Ser. No. 10/513,397; U.S. patent: application Ser. No. 10/513,605; PCT Application No. US03/14137, now expired; U.S. patent application Ser. No. 10/430,426, now U.S. Pat. No. 7,132,621; PCT Application No. US03/14121, now expired; U.S. patent application Ser. No. 10/513,604; and PCT Application No. US03/14135, now expired.

Illustrative Plasma-Assisted Joining System

Figure 1:
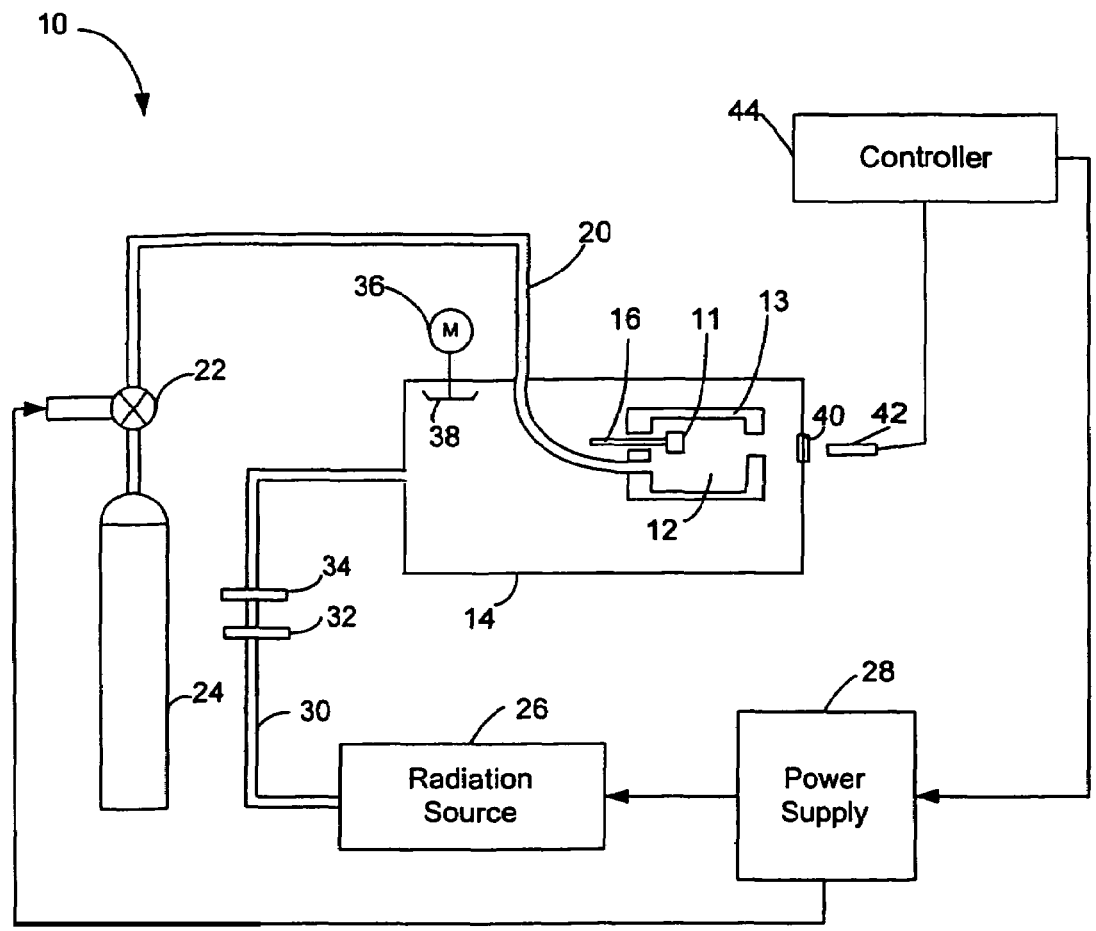
FIG. 1 shows a schematic diagram of an illustrative plasma system consistent with this invention.

FIG. 1 shows illustrative plasma-assisted joining system 10 consistent with one aspect of this invention. In this embodiment, plasma-joining cavity 12 is formed in vessel 13 that is positioned inside radiation chamber (i.e., applicator) 14. In another embodiment (not shown), vessel 13 and radiation chamber 14 are the same, thereby eliminating the need for two separate components.

Vessel 13 can include one or more radiation-transmissive insulating layers to improve its thermal insulation properties without significantly shielding cavity 12 from the radiation used to form a plasma. It will be appreciated that more than one cavity can be formed in vessel 13. In one embodiment, multiple cavities can be formed in vessel 13 and those cavities can be in fluid communication with one another. At least one portion of each of parts 11 and 16 can be placed in cavity 12. As described more fully below, plasma-assisted joining consistent with this invention can involve generating a plasma in selected regions and preventing a plasma in others.

As used herein, a plasma-joining cavity is any localized volume capable of igniting, modulating, and/or sustaining a plasma. Thus, it will be appreciated that a cavity consistent with this invention need not be completely closed, and may indeed be open. It is known that a plasma can be ignited by subjecting a gas to a sufficient amount of radiation. The plasma may then be modulated or sustained by direct absorption of the radiation, but may be assisted by a plasma catalyst during joining.

In one embodiment, cavity 12 is formed in a vessel made of ceramic. Due to the extremely high temperatures that can be achieved with plasmas consistent with this invention, a ceramic capable of operating at, for example, about 3,000 degrees Fahrenheit can be used. The ceramic material can include, by weight, 29.8% silica, 68.2% alumina, 0.4% ferric oxide, 1% titania, 0.1% lime, 0.1% magnesia, 0.4% alkalies, which is sold under Model No. LW-30 by New Castle Refractories Company, of New Castle, Pa. It will be appreciated by those of ordinary skill in the art, however, that other materials, such as quartz, and those different from the one described above, can also be used consistent with the invention. It will also be appreciated that because the operating temperature can be different for different joining processes, the material used to make the vessel may only need to withstand temperatures substantially below 3,000 degree Fahrenheit, such as 2,500 degrees or about 1,000 degree Fahrenheit, or even lower.

In one successful experiment, a catalyzed joining plasma was formed in a partially open cavity inside a first brick and topped with a second brick. The cavity had dimensions of about 2 inches by about 2 inches by about 1.5 inches. At least two holes were also provided in the brick in communication with the cavity: one for viewing the plasma and at least one hole for providing the gas. The size of the cavity can depend on the desired joining process being performed. Also, the cavity can be configured to prevent the plasma from rising/floating away from the primary processing region.

As shown in FIG. 1, for example, cavity 12 can be connected to one or more gas sources 24 (e.g., a source of argon, nitrogen, hydrogen, xenon, krypton) by line 20 and control valve 22, which may be powered by power supply 28. Line 20 may be tubing or any other device capable of delivering a gas. In one embodiment, the diameter of the tube is sufficiently small to prevent radiation leakage (e.g., between about 1/16 inch and about 1/4 inch, such as about 1/8"). Also, if desired, a vacuum pump (not shown) can be connected to the chamber to remove any undesirable fumes that may be generated during joining. Although not shown in FIG. 1, cavity 12 and chamber 14 can have a separate gas port for removing gas.

A radiation leak detector (not shown) was installed near source 26 and waveguide 30 and connected to a safety interlock system to automatically turn off the radiation (e.g., microwave) power supply if a leak above a predefined safety limit, such as one specified by the FCC and/or OSHA (e.g., 5 mW/cm$^2$), was detected.

Radiation source 26, which may be powered by electrical power supply 28, can direct radiation energy into chamber 14 through one or more waveguides 30. It will be appreciated by those of ordinary skill in the art that source 26 can be connected directly to cavity 12 or chamber 14, thereby eliminating waveguide 30. The radiation energy entering cavity 12 can be used to ignite a plasma within the cavity with the assistance of a plasma catalyst. This plasma can be substantially sustained and confined to the cavity by coupling additional radiation with the catalyst.

Radiation energy can be supplied through optional circulator 32 and tuner 34 (e.g., 3-stub tuner). Tuner 34 can be used to minimize the reflected power as a function of changing ignition or processing conditions, especially before the plasma has formed because radiation power, for example, will be strongly absorbed by the plasma.

As explained more fully below, the location of cavity 12 in chamber 14 may not be critical if chamber 14 supports multiple modes, and especially when the modes are continually or periodically mixed. As also explained more fully below, motor 36 can be connected to mode-mixer 38 for making the time-averaged radiation energy distribution substantially uniform throughout chamber 14. Furthermore, as shown in FIG. 1, for example, window 40 (e.g., a quartz window) can be disposed in one wall of chamber 14 adjacent to cavity 12, permitting temperature sensor 42 (e.g., an optical pyrometer) to be used to view a process inside cavity 12. In one embodiment, the optical pyrometer output can increase from zero volts as the temperature rises to within the tracking range.

Sensor 42 can develop output signals as a function of the temperature or any other monitorable condition associated with work piece 11 within cavity 12 and provide the signals to controller 44. Dual temperature sensing and heating, as well as automated cooling rate and gas flow controls, can also be used. Controller 44 in turn can be used to control operation of power supply 28, which can have one output connected to source 26 as described above and another output connected to valve 22 to control gas flow into cavity 12. Although not shown in FIG. 1, chamber 14 can have a separate gas port for removing exhaust fumes.

The invention has been practiced with equal success employing microwave sources at both 915 MHz and 2.45 GHz provided by Communications and Power Industries (CPI), although radiation having any frequency less than about 333 GHz can be used. The 2.45 GHz system provided continuously variable microwave power from about 5.0 kilowatts to about 5.0 kilowatts. A 3-stub tuner allowed impedance matching for maximum power transfer and a dual directional coupler (not shown) was used to measure forward and reflected powers. Also, optical pyrometers were used for remote sensing of the sample temperature.

As mentioned above, radiation having any frequency less than about 333 GHz can be used consistent with this invention. For example, frequencies, such as power line frequencies (about 50 Hz to about 60 Hz), can be used, although the pressure of the gas from which the joining plasma is formed may be lowered to assist with plasma ignition. Also, any radio frequency or microwave frequency can be used consistent with this invention, including frequencies greater than about 100 kHz. In most cases, the gas pressure for such relatively high frequencies need not be lowered to ignite, modulate, or sustain a plasma, thereby enabling many plasma-processes to occur at atmospheric pressures and above.

The equipment was computer controlled using LabView 6i software, which provided real-time temperature monitoring and microwave power control. Noise was reduced by using sliding averages of suitable number of data points. Also, to improve speed and computational efficiency, the number of stored data points in the buffer array was limited by using shift registers and buffer sizing. The pyrometer measured the temperature of a sensitive area of about 1 $cm^2$, which was used to calculate an average temperature. The pyrometer sensed radiant intensities at two wavelengths and fit those intensities using Planck's law to determine the temperature.

It will be appreciated, however, that other devices and methods for monitoring and controlling temperature are also available and can be used consistent with this invention. Control software that can be used consistent with this invention is described, for example, in commonly owned, concurrently filed PCT Application No. US03/14135, now expired, which is hereby incorporated by reference in its entirety.

Chamber 14 had several glass-covered viewing ports with radiation shields and one quartz window for pyrometer access. Several ports for connection to a vacuum pump and a gas source were also provided, although not necessarily used.

System 10 also included a closed-loop deionized water-cooling system (not shown) with an external heat exchanger cooled by tap water. During operation, the deionized water first cooled the magnetron, then the load-dump in the circulator (used to protect the magnetron), and finally the radiation chamber through water channels welded on the outer surface of the chamber.

Plasma Catalysts

A plasma catalyst consistent with this invention can include one or more different materials and may be either passive or active. A plasma catalyst can be used, among other things, to ignite, modulate, and/or sustain a plasma at a gas pressure that is less than, equal to, or greater than atmospheric pressure.

One method of forming a joining plasma consistent with this invention can include subjecting a gas in a cavity to electromagnetic radiation having a frequency less than about 333 GHz in the presence of a passive plasma catalyst. A passive plasma catalyst consistent with this invention can include any object capable of inducing a plasma by deforming a local electric field (e.g., an electromagnetic field) consistent with this invention, without necessarily adding additional energy through the catalyst, such as by applying an electric voltage to create a spark.

A passive plasma catalyst consistent with this invention can be, for example, a nano-particle or a nano-tube. As used herein, the term "nano-particle" can include any particle having a maximum physical dimension less than about 100 nm that is at least electrically semi-conductive. Also, both single-walled and multi-walled carbon nano-tubes, doped and undoped, can be particularly effective for igniting plasmas consistent with this invention because of their exceptional electrical conductivity and elongated shape. The nano-tubes can have any convenient length and can be a powder fixed to a substrate. If fixed, the nano-tubes can be oriented randomly on the surface of the substrate or fixed to the substrate (e.g., at some predetermined orientation) while the plasma is ignited or sustained.

A passive plasma catalyst can also be a powder consistent with this invention, and need not comprise nano-particles or nano-tubes. It can be formed, for example, from fibers, dust particles, flakes, sheets, etc. When in powder form, the catalyst can be suspended, at least temporarily, in a gas. By suspending the powder in the gas, the powder can be quickly dispersed throughout the cavity and more easily consumed, if desired.

Figure 2:
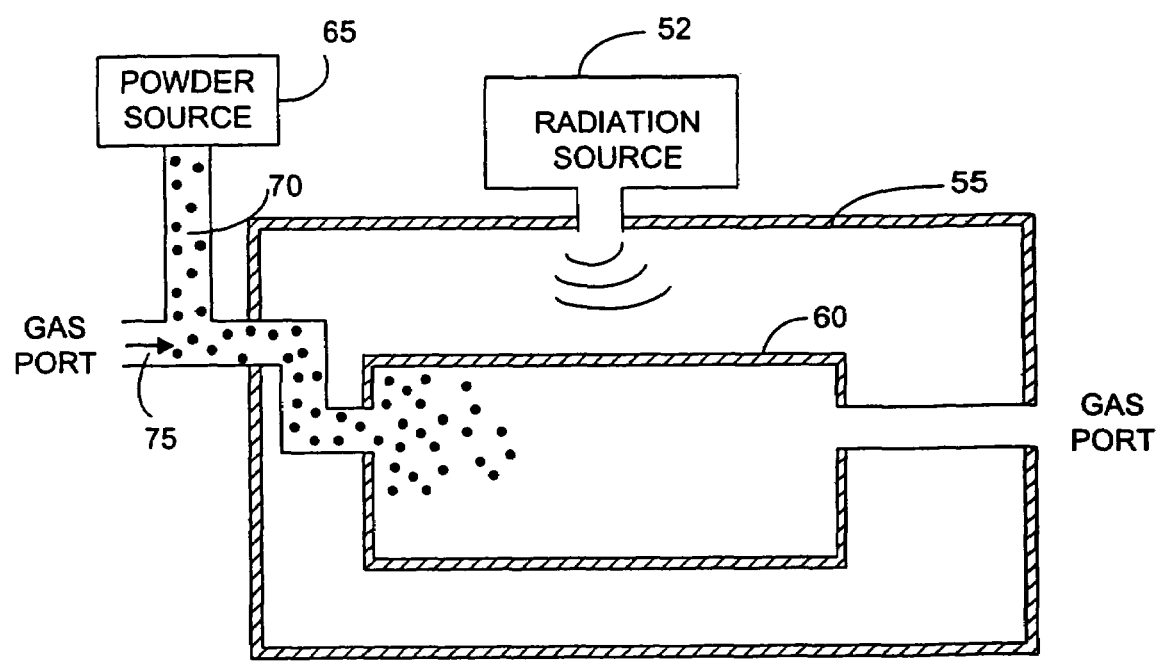
FIG. 2 shows an illustrative embodiment of a portion of a plasma system for adding a powder plasma catalyst to a plasma cavity for igniting, modulating, or sustaining a plasma in a cavity consistent with this invention.

In one embodiment, the powder catalyst can be carried into the cavity and at least temporarily suspended with a carrier gas. The carrier gas can be the same or different from the gas that forms the plasma. Also, the powder can be added to the gas prior to being introduced to the cavity. For example, as shown in FIG. 2, radiation source 52 can supply radiation to radiation chamber 55, in which plasma cavity 60 is placed. Powder source 65 can provide catalytic powder 70 into gas stream 75. In an alternative embodiment, powder 70 can be first added to cavity 60 in bulk (e.g., in a pile) and then distributed in cavity 60 in any number of ways, including flowing a gas through or over the bulk powder. In addition, the powder can be added to the gas for igniting, modulating, or sustaining a plasma by moving, conveying, drizzling, sprinkling, blowing, or otherwise, feeding the powder into or within the cavity.

In one experiment, a joining plasma was ignited in a cavity by placing a pile of carbon fiber powder in a copper pipe that extended into the cavity. Although sufficient radiation was directed into the cavity, the copper pipe shielded the powder from the radiation and no plasma ignition took place. However, once a carrier gas began flowing through the pipe, forcing the powder out of the pipe and into the cavity, and thereby subjecting the powder to the radiation, a plasma was nearly instantaneously ignited in the cavity. Such instantaneous ignition can substantially eliminate potentially damaging radiation that could otherwise reflect back into the radiation source.

A powder plasma catalyst consistent with this invention can be substantially non-combustible, thus it need not contain oxygen or burn in the presence of oxygen. Thus, as mentioned above, the catalyst can include a metal, carbon, a carbon-based alloy, a carbon-based composite, an electrically conductive polymer, a conductive silicone elastomer, a polymer nano-composite, an organic-inorganic composite, and any combination thereof.

Also, powder catalysts can be substantially uniformly distributed in the plasma cavity (e.g., when suspended in a gas), and plasma ignition can be precisely controlled within the cavity consistent with this invention. Uniform ignition can be important in certain applications, including those applications requiring brief plasma exposures, such as in the form of one or more bursts. Still, a certain amount of time can be required for a powder catalyst to distribute itself throughout a cavity, especially in complicated, multi-chamber cavities. Therefore, consistent with another aspect of this invention, a powder catalyst can be introduced into the cavity through a plurality of ignition ports to more rapidly obtain a more uniform catalyst distribution therein (see below).

In addition to powder, a passive plasma catalyst consistent with this invention can include, for example, one or more microscopic or macroscopic fibers, sheets, needles, threads, strands, filaments, yarns, twines, shavings, slivers, chips, woven fabrics, tape, whiskers, or any combination thereof. In these cases, the plasma catalyst can have at least one portion with one physical dimension substantially larger than another physical dimension. For example, the ratio between at least two orthogonal dimensions should be at least about 1:2, but could be greater than about 1:5, or even greater than about 1:10.

Thus, a passive plasma catalyst can include at least one portion of material that is relatively thin compared to its length. A bundle of catalysts (e.g., fibers) may also be used and can include, for example, a section of graphite tape. In one experiment, a section of tape having approximately thirty thousand strands of graphite fiber, each about 2-3 microns in diameter, was successfully used. The number of fibers in and the length of a bundle are not critical to igniting, modulating, or sustaining the plasma. For example, satisfactory results have been obtained using a section of graphite tape about one-quarter inch long. One type of carbon fiber that has been successfully used consistent with this invention is sold under the trademark Magnamite®, Model No. AS4C-GP3K, by the Hexcel Corporation, of Anderson, S.C. Also, silicon-carbide fibers have been successfully used.

A passive plasma catalyst consistent with another aspect of this invention can include one or more portions that are, for example, substantially spherical, annular, pyramidal, cubic, planar, cylindrical, rectangular or elongated.

The passive plasma catalysts discussed above include at least one material that is at least electrically semi-conductive. In one embodiment, the material can be highly electrically conductive. For example, a passive plasma catalyst consistent with this invention can include a metal, an inorganic material, carbon, a carbon-based alloy, a carbon-based composite, an electrically conductive polymer, a conductive silicone elastomer, a polymer nano-composite, an organic-inorganic composite, or any combination thereof. Some of the possible inorganic materials that can be included in the plasma catalyst include carbon, silicon carbide, molybdenum, platinum, tantalum, tungsten, carbon nitride, and aluminum, although other electrically conductive inorganic materials are believed to work just as well.

In addition to one or more electrically conductive materials, a passive plasma catalyst consistent with this invention can include one or more additives (which need not be electrically conductive). As used herein, the additive can include any material that a user wishes to add to the plasma. For example, in doping semiconductors and other materials, one or more dopants can be added to the plasma through the catalyst. See, e.g., commonly owned, concurrently filed U.S. patent application Ser. No. 10/513,397, which is hereby incorporated by reference in its entirety. The catalyst can include the dopant itself, or it can include a. precursor material that, upon decomposition, can form the dopant. Thus, the plasma catalyst can include one or more additives and one or more electrically conductive materials in any desirable ratio, depending on the ultimate desired composition of the plasma and the process using the plasma.

The ratio of the electrically conductive components to the additives in a passive plasma catalyst can vary over time while being consumed. For example, during ignition, the plasma catalyst could desirably include a relatively large percentage of electrically conductive components to improve the ignition conditions. On the other hand, if used while modulating or sustaining the plasma, the catalyst could include a relatively large percentage of additives that may be desirable in a joining process. It will be appreciated by those of ordinary skill in the art that the component ratio of the plasma catalyst used to ignite and, later, to sustain the plasma, could be the same.

A predetermined ratio profile can be used to simplify many plasma processes. In many conventional plasma processes, the components within the plasma are added as necessary, but such addition normally requires programmable equipment to add the components according to a predetermined schedule. However, consistent with this invention, the ratio of components in the catalyst can be varied, and thus the ratio of components in the plasma itself can be automatically varied. That is, the ratio of components in the plasma at any particular time can depend on which of the catalyst portions is currently being consumed by the plasma. Thus, the catalyst component ratio can be different at different locations within the catalyst. And, the current ratio of components in a plasma can depend on the portions of the catalyst currently and/or previously consumed, especially when the flow rate of a gas passing through the plasma chamber is relatively slow.

Figure 3:
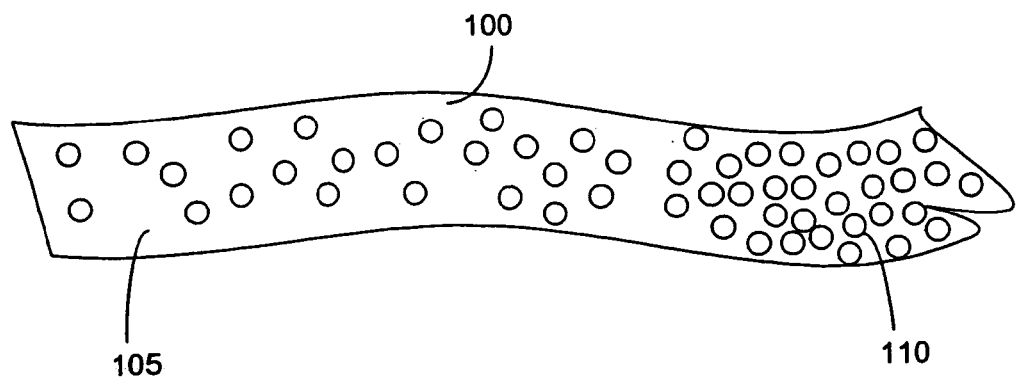
FIG. 3 shows an illustrative plasma catalyst fiber with at least one component having a concentration gradient along its length consistent with this invention.

A passive plasma catalyst consistent with this invention can be homogeneous, inhomogeneous, or graded. Also, the plasma catalyst component ratio can vary continuously or discontinuously throughout the catalyst. For example, in FIG. 3, the ratio can vary smoothly forming a gradient along a length of catalyst 100. Catalyst 100 can include a strand of material that includes a relatively low concentration of a component at section 105 and a continuously increasing concentration toward section 110.

Figure 4:
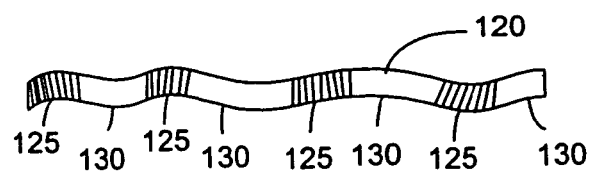
FIG. 4 shows an illustrative plasma catalyst fiber with multiple components at a ratio that varies along its length consistent with this invention.

Alternatively, as shown in FIG. 4, the ratio can vary discontinuously in each portion of catalyst 120, which includes, for example, alternating sections 125 and 130 having different concentrations. It will be appreciated that catalyst 120 can have more than two section types. Thus, the catalytic component ratio being consumed by the plasma can vary in any predetermined fashion. In one embodiment, when the plasma is monitored and a particular additive is detected, further processing can be automatically commenced or terminated.

Another way to vary the ratio of components in a sustained plasma is by introducing multiple catalysts having different component ratios at different times or different rates. For example, multiple catalysts can be introduced at approximately the same location or at different locations within the cavity. When introduced at different locations, the plasma formed in the cavity can have a component concentration gradient determined by the locations of the various catalysts. Thus, an automated system can include a device by which a consumable plasma catalyst is mechanically inserted before and/or during plasma igniting, modulating, and/or sustaining.

Figure 5:
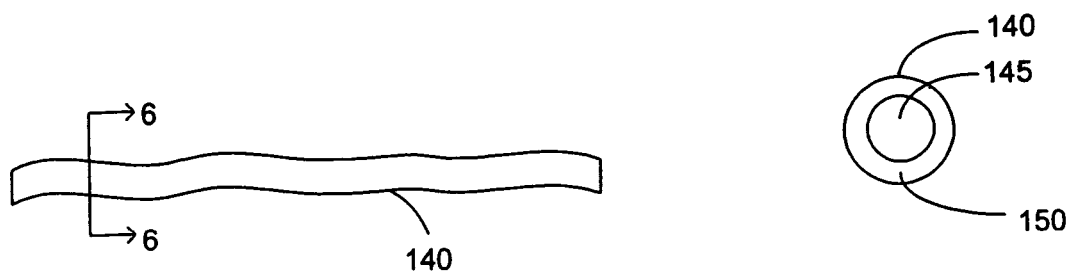
FIG. 5 shows another illustrative plasma catalyst fiber that includes a core underlayer and a coating consistent with this invention.
Figure 6:
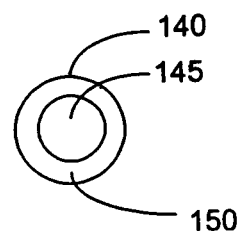
FIG. 6 shows a cross-sectional view of the plasma catalyst fiber of FIG. 5, taken from line 6-6 of FIG. 5, consistent with this invention.

A passive plasma catalyst consistent with this invention can also be coated. In one embodiment, a catalyst can include a substantially non-electrically conductive coating deposited on the surface of a substantially electrically conductive material. Alternatively, the catalyst can include a substantially electrically conductive coating deposited on the surface of a substantially electrically non-conductive material. FIGS. 5 and 6, for example, show fiber 140, which includes underlayer 145 and coating 150. In one embodiment, a plasma catalyst including a carbon core is coated with nickel to prevent oxidation of the carbon.

A single plasma catalyst can also include multiple coatings. If the coatings are consumed during contact with the plasma, the coatings could be introduced into the plasma sequentially, from the outer coating to the innermost coating, thereby creating a time-release mechanism. Thus, a coated plasma catalyst can include any number of materials, as long as a portion of the catalyst is at least electrically semi-conductive.

Consistent with another embodiment of this invention, a plasma catalyst can be located entirely within a radiation cavity to substantially reduce or prevent radiation energy leakage. In this way, the plasma catalyst does not electrically or magnetically couple with the vessel containing the cavity or to any electrically conductive object outside the cavity. This prevents sparking at the ignition port and can prevent radiation from leaking outside the cavity during the ignition and possibly later if the plasma is sustained. In one embodiment, the catalyst can be located at a tip of a substantially electrically non-conductive extender that extends through an ignition port.

Figure 7:
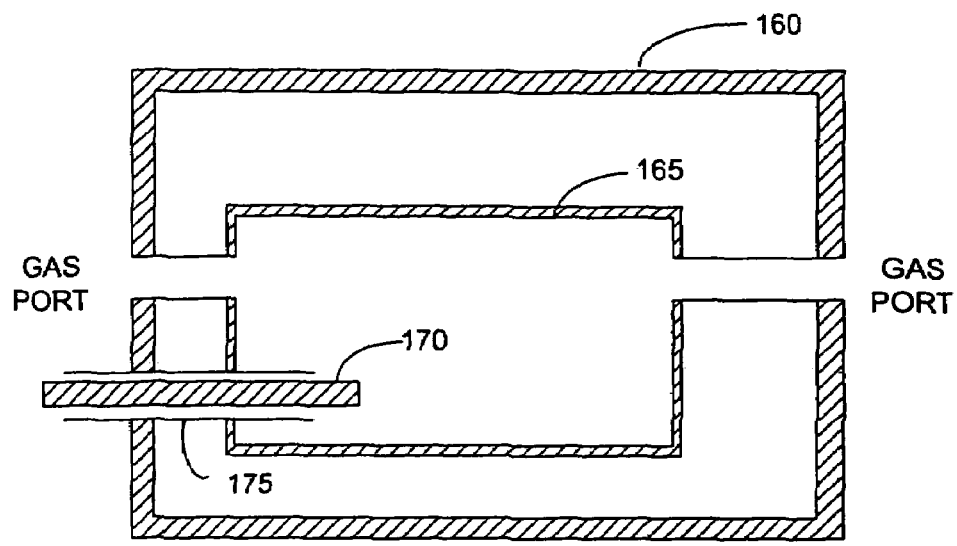
FIG. 7 shows a cross-sectional view of an illustrative embodiment of another plasma-joining system, including an elongated plasma catalyst that extends through an ignition port consistent with this invention.
Figure 8:
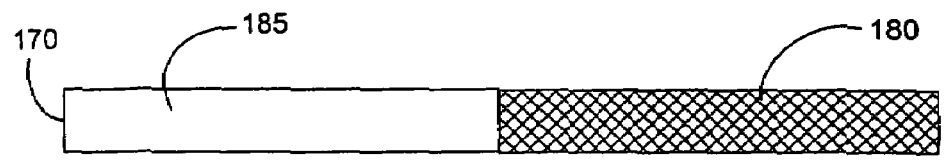
FIG. 8 shows an illustrative embodiment of an elongated plasma catalyst that can be used in the system of FIG. 7 consistent with this invention.

FIG. 7, for example, shows radiation chamber 160 in which plasma-joining cavity 165 is placed. Plasma catalyst 170 is elongated and extends through ignition port 175. As shown in FIG. 8, and consistent with this invention, catalyst 170 can include electrically conductive distal portion 180 (which is placed in chamber 160) and electrically non-conductive portion 185 (which is placed substantially outside chamber 160, but can extend somewhat into chamber 160). This configuration can prevent an electrical connection (e.g., sparking) between distal portion 180 and chamber 160.

Figure 9:
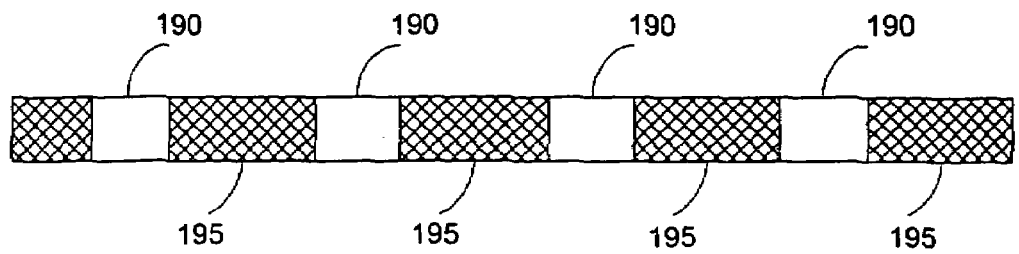
FIG. 9 shows another illustrative embodiment of an elongated plasma catalyst that can be used in the system of FIG. 7 consistent with this invention.

In another embodiment, shown in FIG. 9, the catalyst can be formed from a plurality of electrically conductive segments 190 separated by and mechanically connected to a plurality of electrically non-conductive segments 195. In this embodiment, the catalyst can extend through the ignition port between a point inside the cavity and another point outside the cavity, but the electrically discontinuous profile significantly can prevent sparking and energy leakage.

Another method of forming a plasma consistent with this invention includes subjecting a gas in a cavity to electromagnetic radiation having a frequency less than about 333 GHz in the presence of an active plasma catalyst, which generates or includes at least one ionizing particle.

An active plasma catalyst consistent with this invention can be any particle or high-energy wave packet capable of transferring a sufficient amount of energy to a gaseous atom or molecule to remove at least one electron from the gaseous atom or molecule in the presence of electromagnetic radiation. Depending on the source, the ionizing particles can be directed into the cavity in the form of a focused or collimated beam, or they may be sprayed, spewed, sputtered, or otherwise introduced.

Figure 10:
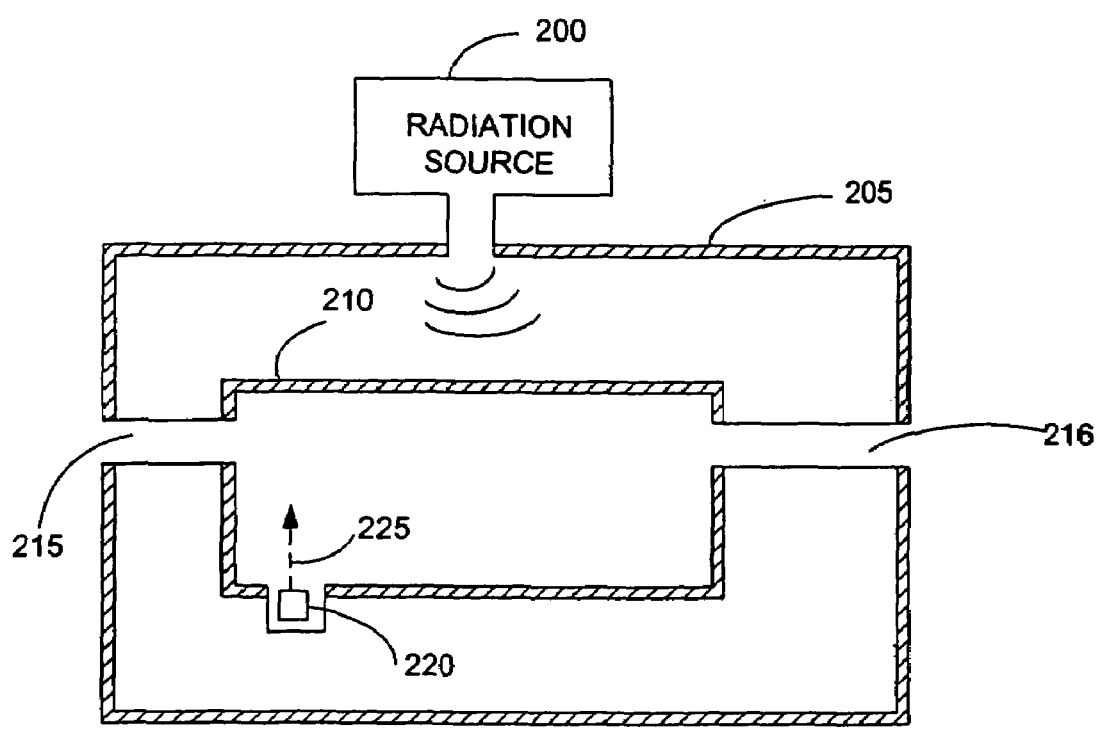
FIG. 10 shows a side cross-sectional view of an illustrative embodiment of a portion of a plasma-joining system for directing ionizing radiation into a plasma cavity consistent with this invention.

For example, FIG. 10 shows radiation source 200 directing radiation into plasma cavity 210, which can be positioned inside of chamber 205. Plasma cavity 210 may permit a gas to flow through it via ports 215 and 216 if desired. Source 220 directs ionizing particles 225 into cavity 210. Source 220 can be protected, for example, by a metallic screen, which allows the ionizing particles to pass through but shields source 220 from radiation. If necessary, source 220 can be water-cooled.

Examples of ionizing particles consistent with this invention can include x-ray particles, gamma ray particles, alpha particles, beta particles, neutrons, protons, and any combination thereof. Thus, an ionizing particle catalyst can be charged (e.g., an ion from an ion source) or uncharged and can be the product of a radioactive fission process. In one embodiment, the vessel in which the plasma cavity is formed could be entirely or partially transmissive to the ionizing particle catalyst. Thus, when a radioactive fission source is located outside the cavity, the source can direct the fission products through the vessel to ignite the plasma. The radioactive fission source can be located inside the radiation chamber to substantially prevent the fission products (i.e., the ionizing particle catalyst) from creating a safety hazard.

In another embodiment, the ionizing particle can be a free electron, but it need not be emitted in a radioactive decay process. For example, the electron can be introduced into the cavity by energizing the electron source (such as a metal), such that the electrons have sufficient energy to escape from the source. The electron source can be located inside the cavity, adjacent the cavity, or even in the cavity wall. It will be appreciated by those of ordinary skill in the art that the any combination of electron sources is possible. A common way to produce electrons is to heat a metal, and these electrons can be further accelerated by applying an electric field.

In addition to electrons, free energetic protons can also be used to catalyze a plasma. In one embodiment, a free proton can be generated by ionizing hydrogen and, optionally, accelerated with an electric field.

Multi-mode Radiation Cavities

A radiation waveguide, cavity, or chamber can be designed to support or facilitate propagation of at least one electromagnetic radiation mode. As used herein, the term "mode" refers to a particular pattern of any standing or propagating electromagnetic wave that satisfies Maxwell's equations and the applicable boundary conditions (e.g., of the cavity). In a waveguide or cavity, the mode can be any one of the various possible patterns of propagating or standing electromagnetic fields. Each mode is characterized by its frequency and polarization of the electric field and/or the magnetic field vectors. The electromagnetic field pattern of a mode depends on the frequency, refractive indices or dielectric constants, and waveguide or cavity geometry.

A transverse electric (TE) mode is one whose electric field vector is normal to the direction of propagation. Similarly, a transverse magnetic (TM) mode is one whose magnetic field vector is normal to the direction of propagation. A transverse electric and magnetic (TEM) mode is one whose electric and magnetic field vectors are both normal to the direction of propagation. A hollow metallic waveguide does not typically support a normal TEM mode of radiation propagation. Even though radiation appears to travel along the length of a waveguide, it may do so only by reflecting off the inner walls of the waveguide at some angle. Hence, depending upon the propagation mode, the radiation (e.g., microwave) may have either some electric field component or some magnetic field component along the axis of the waveguide (often referred to as the z-axis).

The actual field distribution inside a cavity or waveguide is a superposition of the modes therein. Each of the modes can be identified with one or more subscripts (e.g., $TE_{10}$ ("tee ee one zero"). The subscripts normally specify how many "half waves" at the guide wavelength are contained in the x and y directions. It will be appreciated by those skilled in the art that the guide wavelength can be different from the free space wavelength because radiation propagates inside the waveguide by reflecting at some angle from the inner walls of the waveguide. In some cases, a third subscript can be added to define the number of half waves in the standing wave pattern along the z-axis.

For a given radiation frequency, the size of the waveguide can be selected to be small enough so that it can support a single propagation mode. In such a case, the system is called a single-mode system (i.e., a single-mode applicator). The $TE_{10}$ mode is usually dominant in a rectangular single-mode waveguide.

As the size of the waveguide (or the cavity to which the waveguide is connected) increases, the waveguide or applicator can sometimes support additional higher order modes forming a multi-mode system. When many modes are capable of being supported simultaneously, the system is often referred to as highly moded.

A simple, single-mode system has a field distribution that includes at least one maximum and/or minimum. The magnitude of a maximum largely depends on the amount of radiation supplied to the system. Thus, the field distribution of a single mode system is strongly varying and substantially non-uniform.

Unlike a single-mode cavity, a multi-mode cavity can support several propagation modes simultaneously, which, when superimposed, results in a complex field distribution pattern. In such a pattern, the fields tend to spatially smear and, thus, the field distribution usually does not show the same types of strong minima and maxima field values within the cavity. In addition, as explained more fully below, a mode-mixer can be used to "stir" or "redistribute" modes (e.g., by mechanical movement of a radiation reflector). This redistribution desirably provides a more uniform time-averaged field distribution within the cavity.

A multi-mode cavity consistent with this invention can support at least two modes, and may support many more than two modes. Each mode has a maximum electric field vector. Although there may be two or more modes, one mode may be dominant and has a maximum electric field vector magnitude that is larger than the other modes. As used herein, a multi-mode cavity may be any cavity in which the ratio between the first and second mode magnitudes is less than about 1:10, or less than about 1:5, or even less than about 1:2. It will be appreciated by those of ordinary skill in the art that the smaller the ratio, the more distributed the electric field energy between the modes, and hence the more distributed the radiation energy is in the cavity.

The distribution of plasma within a processing cavity may strongly depend on the distribution of the applied radiation. For example, in a pure single mode system, there may only be a single location at which the electric field is a maximum. Therefore, a strong plasma may only form at that single location. In many applications, such a strongly localized plasma could undesirably lead to non-uniform plasma treatment or heating (i.e., localized overheating and underheating).

Whether or not a single or multi-mode cavity is used consistent with this invention, it will be appreciated by those of ordinary skill in the art that the cavity in which the plasma is formed can be completely closed or partially open. For example, in certain applications, such as in plasma-assisted furnaces, the cavity could be entirely closed. See, for example, commonly owned, concurrently filed PCT Application No. US03/14133, now expired, which is fully incorporated herein by reference. In other applications, however, it may be desirable to flow a gas through the cavity, and therefore the cavity must be open to some degree. In this way, the flow, type, and pressure of the flowing gas can be varied over time. This may be desirable because certain gases with lower ionization potentials, such as argon, are easier to ignite but may have other undesirable properties during subsequent plasma processing.

Mode-mixing

For many joining applications, a cavity containing a uniform plasma is desirable. However, because radiation can have a relatively long wavelength (e.g., several tens of centimeters), obtaining a substantially uniform plasma distribution can be difficult to achieve. As a result, consistent with one aspect of this invention, the radiation modes in a multi-mode joining cavity can be mixed, or redistributed, over a period of time. Because the field distribution within the cavity must satisfy all of the boundary conditions set by the inner surface of the cavity, those field distributions can be changed by changing the position of any portion of that inner surface.

In one embodiment consistent with this invention, a movable reflective surface can be located inside the radiation cavity. The shape and motion of the reflective surface should, when combined, change the inner surface of the cavity during motion. For example, an "L" shaped metallic object (i.e., "mode-mixer") when rotated about any axis will change the location or the orientation of the reflective surfaces in the cavity and therefore change the radiation distribution therein. Any other asymmetrically shaped object can also be used (when rotated), but symmetrically shaped objects can also work, as long as the relative motion (e.g., rotation, translation, or a combination of both) causes some change in location or orientation of the reflective surfaces. In one embodiment, a mode-mixer can be a cylinder that is rotable about an axis that is not the cylinder's longitudinal axis.

Each mode of a multi-mode cavity may have at least one maximum electric field vector, but each of these vectors could occur periodically across the inner dimension of the cavity. Normally, these maxima are fixed, assuming that the frequency of the radiation does not change. However, by moving a mode-mixer such that it interacts with the radiation, it is possible to move the positions of the maxima. For example, mode-mixer 38 of FIG. 1 can be used to optimize the field distribution within cavity 12 such that the plasma ignition conditions and/or the plasma sustaining conditions are optimized. Thus, once a plasma is excited, the position of the mode-mixer can be changed to move the position of the maxima for a uniform time-averaged plasma process (e.g., heating).

Thus, consistent with this invention, mode-mixing can be useful during plasma ignition. For example, when an electrically conductive fiber is used as a plasma catalyst, it is known that the fiber's orientation can strongly affect the minimum plasma-ignition conditions. It has been reported, for example, that when such a fiber is oriented at an angle that is greater than 60° to the electric field, the catalyst does little to improve, or relax, these conditions. By moving a reflective surface either in or near the cavity, however, the electric field distribution can be significantly changed.

Mode-mixing can also be achieved by launching the radiation into the applicator chamber through, for example, a rotating waveguide joint that can be mounted inside the applicator chamber. The rotary joint can be mechanically moved (e.g., rotated) to effectively launch the radiation in different directions in the radiation chamber. As a result, a changing field pattern can be generated inside the applicator chamber.

Mode-mixing can also be achieved by launching radiation in the radiation chamber through a flexible waveguide. In one embodiment, the waveguide can be mounted inside the chamber. In another embodiment, the waveguide can extend into the chamber. The position of the end portion of the flexible waveguide can be continually or periodically moved (e.g., bent) in any suitable manner to launch the radiation (e.g., microwave radiation) into the chamber at different directions and/or locations. This movement can also result in mode-mixing and facilitate more uniform plasma processing (e.g., heating) on a time-averaged basis. Alternatively, this movement can be used to optimize the location of a plasma for ignition or other plasma-assisted process.

If the flexible waveguide is rectangular, a simple twisting of the open end of the waveguide will rotate the orientation of the electric and the magnetic field vectors in the radiation inside the applicator chamber. Then, a periodic twisting of the waveguide can result in mode-mixing as well as rotating the electric field, which can be used to assist ignition, modulation, or sustaining of a plasma.

Thus, even if the initial orientation of the catalyst is perpendicular to the electric field, the redirection of the electric field vectors can change the ineffective orientation to a more effective one. Those skilled in the art will appreciate that mode-mixing can be continuous, periodic, or preprogrammed.

In addition to plasma ignition, mode-mixing can be useful during subsequent plasma processing to reduce or create (e.g., tune) "hot spots" in the chamber. When a processing cavity only supports a small number of modes (e.g., less than 5), one or more localized electric field maxima can lead to "hot spots" (e.g., within cavity 12). In one embodiment, these hot spots could be configured to coincide with one or more separate, but simultaneous, plasma ignitions or processing events. Thus, the plasma catalyst can be located at one or more of those ignition or subsequent processing positions.

Multi-location Ignition

A plasma can be ignited using multiple plasma catalysts at different locations. In one embodiment, multiple fibers can be used to ignite the plasma at different points within the cavity. Such multi-point ignition can be especially beneficial when a uniform plasma ignition is desired. For example, when a plasma is modulated at a high frequency (i.e., tens of Hertz and higher), or ignited in a relatively large volume, or both, substantially uniform instantaneous striking and restriking of the plasma can be improved. Alternatively, when plasma catalysts are used at multiple points, they can be used to sequentially ignite a plasma at different locations within a plasma chamber by selectively introducing the catalyst at those different locations. In this way, a plasma ignition gradient can be controllably formed within the cavity, if desired.

Also, in a multi-mode joining cavity, random distribution of the catalyst throughout multiple locations in the cavity increases the likelihood that at least one of the fibers, or any other passive plasma catalyst consistent with this invention, is optimally oriented with the electric field lines. Still, even where the catalyst is not optimally oriented (not substantially aligned with the electric field lines), the ignition conditions are improved.

Furthermore, because a catalytic powder can be suspended in a gas, it is believed that each powder particle may have the effect of being placed at a different physical location within the cavity, thereby improving ignition uniformity within the cavity.

Dual-Cavity Plasma Igniting/Sustaining

A dual-cavity arrangement can be used to ignite and sustain a joining plasma consistent with this invention. In one embodiment, a system includes at least an ignition cavity and a second cavity in fluid communication with the ignition cavity. To ignite a plasma, a gas in the ignition cavity can be subjected to electromagnetic radiation having a frequency less than about 333 GHz, optionally in the presence of a plasma catalyst. In this way, the proximity of the first and second cavities may permit a plasma formed in the first cavity to ignite a plasma in the second cavity, which may be sustained with additional electromagnetic radiation.

In one embodiment of this invention, the ignition cavity can be very small and designed primarily, or solely, for plasma ignition. In this way, very little radiation energy may be required to ignite the plasma, permitting easier ignition, especially when a plasma catalyst is used consistent with this invention.

In one embodiment, the ignition cavity may be a substantially single mode cavity and the second cavity a multi-mode cavity. When the ignition cavity only supports a single mode, the electric field distribution may strongly vary within the cavity, forming one or more precisely located electric field maxima. Such maxima are normally the first locations at which plasmas ignite, making them ideal points for placing plasma catalysts. It will be appreciated, however, that when a plasma catalyst is used, it need not be placed in the electric field maximum and, many cases, need not be oriented in any particular direction.

Illustrative Plasma-assisted Joining

As used herein, the term "plasma-assisted joining," or simply "joining," refers to any operation, or combination of operations, thatinvolves the use of a plasma to put or bring together at least two parts and joining them so as to form a unit. Thus, plasma-assisted joining can include, for example, brazing, welding, bonding, soldering, fusing, etc.

Plasma-assisted joining consistent with this invention may include placing at least a first joining area of a first part and a second joining area of a second part in proximity to one another in or near a joining cavity. The joining areas of the parts can be, for example, metal, non-metal, or a combination thereof. As described above, a gas may be directed into the cavity in an amount sufficient to at least form a plasma and then to either modulate or sustain the plasma. The plasma can be modulated or sustained in the cavity by continued absorption of radiation until the at least two joining areas are joined to one another or until a predetermined temperature indicative of a particular joining status is attained.

As described more fully above, the distribution of plasma within a joining cavity can depend on the distribution of the applied radiation. For example, a strong plasma may only form at locations at which the electric field (e.g., the radiation density) is large. Because the strength of the electric field can be reduced, or even made to be zero near the inner surface of the cavity, plasma formation can be prevented at that surface. Therefore, the inner surface of a cavity can be contoured to selectively form a plasma only where parts should be heated to allow proper joining. Similarly, the electric field may not be sufficiently strong to form plasma at other locations, such as where the inner surface of the cavity (e.g., a metallic surface) is separated from the surface of the part by a distance less than about λ/4. In addition, controlling the plasma volume in the proximity of a particular surface area of the object can be used to control the thermal energy delivered to that surface area.

Figure 11:
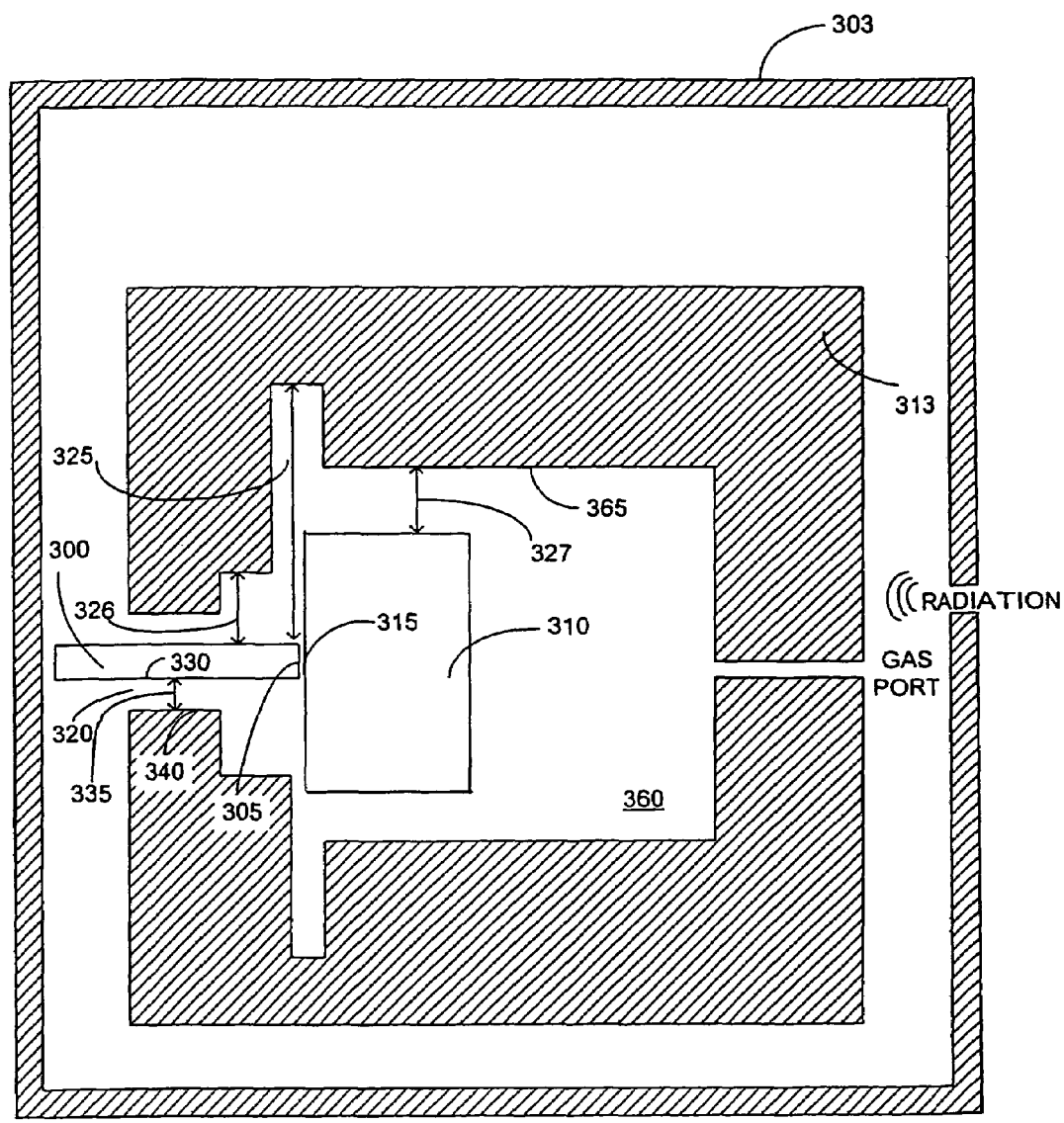
FIG. 11 shows a cross-sectional view of yet another illustrative embodiment of a plasma-joining cavity and areas of objects to be joined that have been inserted into the cavity consistent with this invention.

FIG. 11, for example, shows a cross-sectional view of plasma processing cavity 360 formed in vessel 313 consistent with this invention. Joining areas 305 and 315 of parts 300 and 310, respectively, can be located in cavity 360. In this example, vessel 313 can be placed inside radiation chamber 303, which can be electrically conductive, and vessel 313, which can be substantially transparent to plasma-forming radiation. In this example, inner wall 365 of cavity 360 may be custom-configured to conform, in at least some areas, to the parts, especially where a small gap is desirable to suppress plasma heating. Alternatively, plasma formation can be prevented by shielding a portion of the object's surface with a substantially radiation opaque material, yet not necessarily by a contoured cavity surface.

Inner surface 365 can be shaped to hold parts 300 and 310 such that joining areas 305 and 315 are spaced from inner surface 365 by distance 325 of at least about λ/4, wherein λ is the wavelength of the applied radiation. Other surface portions of parts 300 and 310 can be spaced from inner surface 365 by a distance of less than about λ/4, such as by distance 326 or 327. Also, distance 335, located between surface 330 and surface 340 of cavity 360 at aperture 320, can be less than about λ/4 to substantially confine the plasma within cavity 360 and substantially prevent any plasma from forming in the region where the gaps are less than about λ/4 there.

An opening in the cavity wall 313 can be present and sufficient, however, to permit a gas to flow therethrough, if desired. Also, it will be appreciated that although one gas port is shown, aperture 320 can act as another port, or vessel 313 can have more than one gas port. It will also be appreciated that object 300 can act as a partial seal at aperture 320 and can be supported there.

An electric bias may be applied to any of the joining areas during a plasma-assisted joining process consistent with the invention. Such a bias may facilitate heating of the joining areas by attracting the charged ions in the plasma to the joining areas, which may encourage uniform coverage of the plasma over the joining areas. The bias applied to the joining areas may be, for example, AC, DC, pulsed, continuous, or periodic. The magnitude of the bias may be selected according to the particular application. For example, the magnitude of the voltage may range from about 0.1 volts to about 100 volts, or even several hundred or thousands of volts, depending on the desired rate of attraction of the ionized species. Further, the bias may be positive, negative, or alternate therebetween. It will be appreciated that the parts or joining areas may be placed on an electrically conductive plate and a potential bias may be applied to the plate during a plasma-assisted process consistent with the invention.

Figure 12:
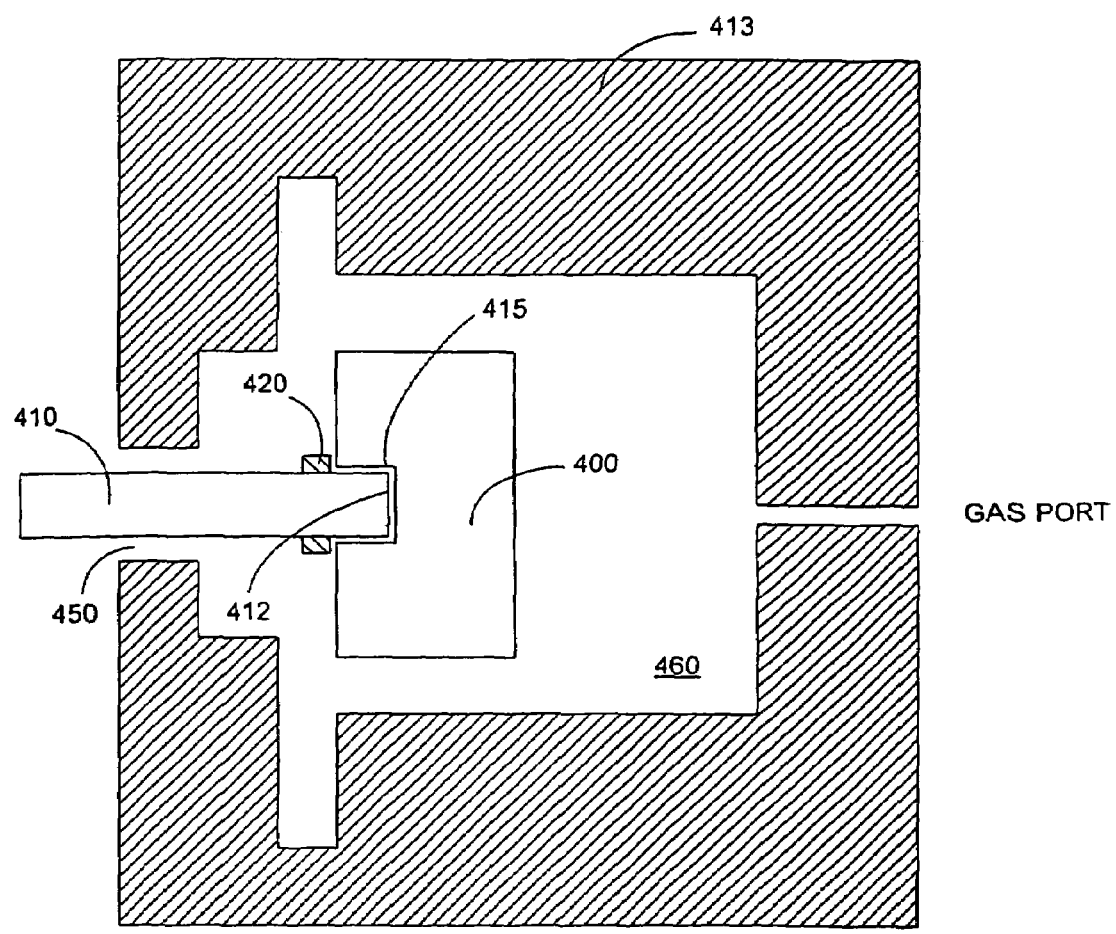
FIG. 12 shows a cross-sectional view of still another illustrative embodiment of a plasma-joining cavity, joining areas, and a brazing ring in the cavity consistent with this invention.

FIG. 12 shows a side cross-sectional view of illustrative plasma joining cavity 460 formed in vessel 413 and parts 400 and 410 that are to be joined to each other. Brazing ring 420 can include any type of brazing material and may at least partially encircle part 410 and may abut an outside surface of block 400. This may be the case, for example, when part 410 is a metallic tube and part 400 is a metallic block, which may have recess 415. In this case, end 412 of tube 410 may be inserted into recess 415 in block 400. Alternatively, end 412 can just touch a portion of block 400 without any insertion. Brazing ring 420 can be formed, for example, from metal, metal powder, flux, and any combination thereof. As shown in FIG. 12, block 400, tube 410, and brazing ring 420 can be placed in cavity 460, with tube 410 extending through opening 450 in vessel 413. In this embodiment, joining can result from at least a partial melting and freezing of brazing ring 420. At least one plasma catalyst (as described above) may also be placed within or near cavity 460 to assist in the formation of the joining plasma, if desired.

Figure 13:
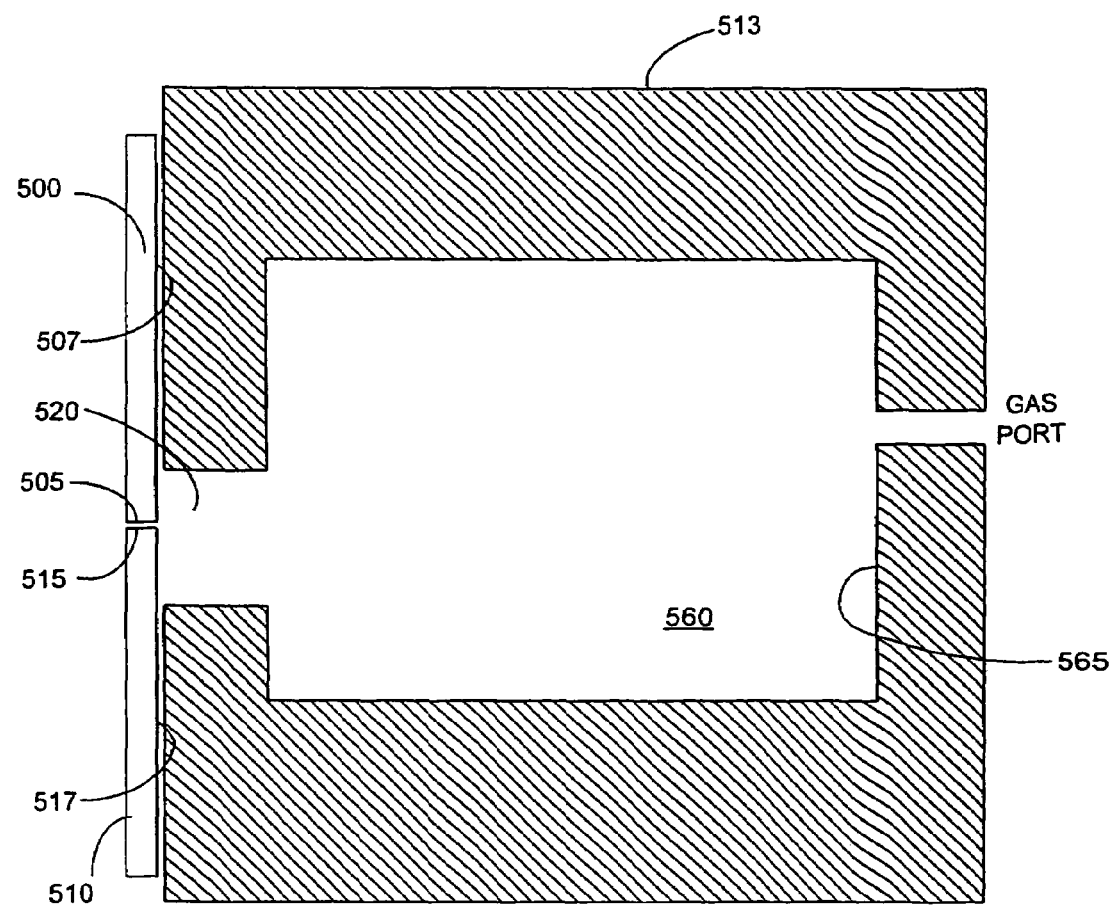
FIG. 13 shows a cross-sectional view of yet another illustrative embodiment of a plasma-joining cavity and joining areas where the joining areas can act as a partial seal consistent with this invention.

FIG. 13 shows a cross-sectional view of plasma joining cavity 560 formed in vessel 513, as well as parts 500 and 510 that are to be joined to each other. In this embodiment, non-joining areas 507 and 517, as well as joining areas 505 and 515, when placed close to vessel 513, can fully or partially seal aperture 520, although sealing is unnecessary. Joining areas 505 and 515 can be spaced from inner surface 565 of cavity 560 by a distance of at least about λ/4, wherein λ is the wavelength of the applied radiation used to form a plasma in the vicinity of joint areas 505 and 515, to permit plasma formation at those areas. It will be appreciated that any plasma catalyst can be used to ignite, modulate, and sustain a plasma in cavity 560 consistent with this invention.

As described above, a temperature associated with the joining process may be monitored by at least one temperature sensor and used to control the plasma-assisted joining process. The temperature of any part, such as part 400 or part 410 of FIG. 12, or an inner surface of a cavity, such as surface 365 of FIG. 11, can therefore be monitored. If a color pyrometer is used, the color of radiation emitted from a surface can be monitored during the plasma-assisted joining process. When the brazing ring melts, it may produce some additional emission in the plasma that can generate a sharp spike in the output of the temperature sensor. When the temperature reaches a pre-determined level, for example, upon detecting a temperature spike, the spike can indicate that the brazing ring has melted and the process is complete. In this case, controller 44 can be programmed to turn off radiation source 26 immediately or after a preset delay time, if necessary, and close control valve 22. In another embodiment, control valve 22 may remain open for a period of time after the joining process for faster cooling of parts 11. Those skilled in the art will appreciate that the emission of additional radiation from the plasma upon melting of the brazing ring can be detected by any suitable optical sensor (e.g., a photodiode, a photomultiplier tube, a hollow cathode lamp etc.), with or without a suitable wavelength selective filter.

In one embodiment consistent with this invention, a plasma can also be used to rapidly develop high-temperatures for the purpose of joining metals to non-metals, for example, metals to glass. Advantageously, the joining of two different materials can involve localized heating and melting near the joining areas only. Glass (or quartz) to metal seals, for example, can be used in making light bulbs (e.g., incandescent, quartz-halogen, sodium, mercury, and other types of light bulbs).

For glass-metal joints capable of maintaining hermetic seals over a wide range of temperatures, the two materials can have nearly the same thermal expansion coefficients. Alternatively, we can have "graded" seals in which the joining material (e.g., brazing ring material) composition varies gradually at the joining area such that there is no abrupt transition in the thermal expansion characteristics at any point or region of the joint. In one embodiment, the joint can be formed while maintaining a gap between joining areas, with the powder metal/glass mixture placed in the gap with a suitable concentration variation. After the mixture is placed in the gap, the joint can be fused with plasma-assisted heating consistent with this invention.

In another embodiment, the parts to be joined can be placed in individual cavities formed in one or more radiation-transmissive blocks, such as ceramic blocks. At least one plasma catalyst can be placed in each of the cavities to ignite and/or sustain the plasma there. In this example, radiation can be generated from one radiation source or several combined radiation sources. The radiation can be provided to the individual cavities through an appropriately shaped waveguide (e.g., a horn that connects the radiation source(s) to the individual cavities formed in a large ceramic block) or supplied directly without the use of a waveguide.

In the foregoing described embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description of Embodiments, with each claim standing on its own as a separate preferred embodiment of the invention.

We claim:

1. A method of joining at least a first joining area of a first part and a second joining area of a second part, the method comprising:
    placing at least the first and second joining areas in proximity to one another near an aperture of a plasma-joining cavity, so that said first and second joining areas fully seal or partially seal said aperture;
    forming a plasma in the cavity by subjecting a gas to electromagnetic radiation having a frequency less than about 333 GHz in the presence of a plasma catalyst; and
    sustaining the plasma at least until the first and second joining areas are joined by directing the radiation into the cavity.

2. The method as recited in claim 1, wherein placing at least the first and second joining areas near the aperture of and exterior to the plasma-joining cavity includes spacing each of said first and second joining areas a distance of at least $\lambda/4$ from an inner surface of said plasma-joining cavity, where $\lambda$ is a wavelength of the applied electromagnetic radiation.

3. The method as recited in claim 1, further comprising making a time-averaged distribution of radiation substantially uniform within the cavity.

4. The method as recited in claim 1, further comprising monitoring an emission from the plasma for intensity, wherein sustaining the plasma is performed until a spike appears in the emission intensity.

5. The method as recited in claim 1, further comprising introducing a plasma catalyst into the plasma-joining cavity through at least one ignition port.

6. The method as recited in claim 5, wherein a plasma catalyst component ratio in the plasma catalyst can vary continuously or discontinuously throughout the plasma-joining cavity.

7. The method as recited in claim 5, wherein the plasma catalyst includes multiple catalysts.

8. The method as recited in claim 5, wherein the plasma catalyst is suspended in a fluid before being introduced into the plasma-joining cavity.

9. The method as recited in claim 5, wherein the plasma catalyst is uniformly or substantially uniformly distributed throughout the plasma-joining cavity when introduced into said plasma-joining cavity.

10. The method as recited in claim 9, wherein distribution of the plasma catalyst into the plasma-joining cavity is homogeneous, non-homogeneous, well-graded or gap-graded.

11. The method as recited in claim 1, further comprising contouring an inner surface of the plasma-joining cavity or an inner surface of the aperture to the plasma-joining cavity to selectively form a plasma where elevated heating is desired.

* * * * *

UNITED STATES PATENT AND TRADEMARK OFFICE
CERTIFICATE OF CORRECTION

PATENT NO. : 7,309,843 B2
APPLICATION NO. : 10/971180
DATED : December 18, 2007
INVENTOR(S) : Devendra Kumar et al.

It is certified that error appears in the above-identified patent and that said Letters Patent is hereby corrected as shown below:

Column 3, line 1. "connonly" should read --commonly--;

Column 14, line 42. "thatinvolves" should read --that involves--.

Signed and Sealed this

Seventh Day of October, 2008

JON W. DUDAS
*Director of the United States Patent and Trademark Office*